(12) United States Patent
Sugahara

(10) Patent No.: US 8,973,228 B2
(45) Date of Patent: Mar. 10, 2015

(54) METHOD FOR PRODUCING PIEZOELECTRIC ACTUATOR AND METHOD FOR PRODUCING LIQUID TRANSPORT APPARATUS

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 929 days.

(21) Appl. No.: 12/364,500

(22) Filed: Feb. 2, 2009

(65) Prior Publication Data
US 2009/0193635 A1    Aug. 6, 2009

(30) Foreign Application Priority Data

Jan. 31, 2008  (JP) ................................. 2008-020567

(51) Int. Cl.
*B41J 2/16*    (2006.01)
*B41J 2/295*    (2006.01)
(Continued)

(52) U.S. Cl.
CPC .......... *B41J 2/14233* (2013.01); *B41J 2/14274* (2013.01); *B41J 2/161* (2013.01); *B41J 2/1612* (2013.01); *B41J 2/1623* (2013.01);
(Continued)

(58) Field of Classification Search
CPC .... B41J 2/14233; B41J 2/14274; B41J 2/161; B41J 2/1612; B41J 2/1623; B41J 2/1629; B41J 2/1634; B41J 2/1642; B41J 2/1626; B41J 2002/14491; B41J 2002/14266; C23C 24/04; H01L 41/0973; H01L 41/314
USPC ..................... 29/25.35, 890.1, 846, 842, 852; 427/96.7, 448; 118/300; 310/321, 348, 310/365
See application file for complete search history.

(56) References Cited

U.S. PATENT DOCUMENTS 6,256,849 B1    7/2001  Kim
7,419,252 B2    9/2008  Yasui
(Continued)

FOREIGN PATENT DOCUMENTS

JP    59169215 A  *  9/1984    .................. 29/25.35
JP    H11-277754 A    10/1999
(Continued)

OTHER PUBLICATIONS

Machine Languge Translation (English) of Japanese Patent Publication—JP 2001-237467, Mar. 2014.*
(Continued)

*Primary Examiner* — A. Dexter Tugbang
(74) *Attorney, Agent, or Firm* — Baker Botts L.L.P.

(57) ABSTRACT

A vibration layer is formed by the AD method on a cavity plate before forming pressure chambers, a common electrode is formed on the vibration layer, and a piezoelectric layer is formed on the common electrode by the AD method. Subsequently, the pressure chambers are formed in the cavity plate by the etching. After that, individual electrodes are formed on the piezoelectric layer. Subsequently, the stack of the cavity plate, the vibration layer, the common electrode, the piezoelectric layer, and the individual electrodes is heated at about 850° C. to simultaneously perform the annealing of the piezoelectric layer and the sintering of the individual electrodes and the common electrode. Accordingly, the atoms of the cavity plate are suppressed from being diffused into the driving portions of the piezoelectric layer.

14 Claims, 13 Drawing Sheets

(51) Int. Cl.
  *B41J 2/14* (2006.01)
  *H01L 41/09* (2006.01)
  *H01L 41/314* (2013.01)
  *C23C 24/04* (2006.01)

(52) U.S. Cl.
  CPC ............ *B41J 2/1629* (2013.01); *B41J 2/1634* (2013.01); *B41J 2/1642* (2013.01); *B41J 2/1646* (2013.01); *H01L 41/0973* (2013.01); *H01L 41/314* (2013.01); *C23C 24/04* (2013.01); *B41J 2002/14266* (2013.01); *B41J 2002/14491* (2013.01)
  USPC ............ 29/25.35; 29/890.1; 29/842; 29/846; 427/96.7; 427/448; 118/300

(56) References Cited

U.S. PATENT DOCUMENTS

| | | | |
|---|---|---|---|
| 7,456,548 | B2 | 11/2008 | Kubota et al. |
| 2006/0012644 | A1 | 1/2006 | Yasui |
| 2006/0012646 | A1 | 1/2006 | Yasui |
| 2006/0090337 | A1* | 5/2006 | Yasui ............................ 29/890.1 |
| 2006/0119226 | A1 | 6/2006 | Nihei |
| 2006/0124057 | A1* | 6/2006 | Sasaki ...................... 118/300 X |
| 2006/0279170 | A1 | 12/2006 | Yasui |
| 2007/0130740 | A1* | 6/2007 | Mita ............................ 29/25.35 |
| 2007/0228894 | A1 | 10/2007 | Ishikura et al. |
| 2007/0229605 | A1 | 10/2007 | Mita |
| 2007/0262678 | A1 | 11/2007 | Kubota et al. |
| 2008/0030102 | A1 | 2/2008 | Ohnishi et al. |
| 2008/0098582 | A1 | 5/2008 | Ohnishi et al. |
| 2008/0111453 | A1 | 5/2008 | Yoshioka et al. |
| 2008/0238263 | A1 | 10/2008 | Nihei |
| 2009/0174419 | A1 | 7/2009 | Ohnishi et al. |
| 2009/0271964 | A1 | 11/2009 | Nihei |
| 2010/0091073 | A1 | 4/2010 | Nihei |
| 2010/0192341 | A1 | 8/2010 | Ishikura et al. |

FOREIGN PATENT DOCUMENTS

| | | |
|---|---|---|
| JP | 2001-237467 A | 8/2001 |
| JP | 2006-054442 A | 2/2006 |
| JP | 2006-165102 A | 6/2006 |
| JP | 2006-175600 A | 7/2006 |
| JP | 2006-261656 A | 9/2006 |
| JP | 2007-251056 A | 9/2007 |
| JP | 2007-268961 A | 10/2007 |
| JP | 2007-276151 A | 10/2007 |
| JP | 2007-300071 A | 11/2007 |
| JP | 2007-329460 A | 12/2007 |
| WO | 2006-109501 A1 | 10/2006 |

OTHER PUBLICATIONS

Japan Patent Office; Notice of Reasons for Rejection in Japanese Patent Application No. 2008-020567 (counterpart to the above captioned US application) mailed May 25, 2010.

Japan Patent Office, Notice of Reasons for Rejection for Japanese Patent Application No. 2011-154490 (counterpart to above-captioned patent application), mailed Aug. 27, 2013.

Japan Patent Office, Notice of Reasons for Rejection issued for Japanese Patent Application No. 2014-079949, mailed Jan. 6, 2015.

* cited by examiner

SCANNING DIRECTION
PAPER FEEDING DIRECTION

SCANNING DIRECTION

PAPER FEEDING DIRECTION 006-54442, a piezoelectric
METHOD FOR PRODUCING PIEZOELECTRIC ACTUATOR AND METHOD FOR PRODUCING LIQUID TRANSPORT APPARATUS

CROSS REFERENCE TO RELATED APPLICATION

The present application claims priority from Japanese Patent Application No. 2008-020567, filed on Jan. 31, 2008, the disclosure of which is incorporated herein by reference in its entirety.

BACKGROUND OF THE INVENTION

1. Field of the Invention

The present invention relates to a method for producing a piezoelectric actuator which includes a piezoelectric layer, and a method for producing a liquid transport apparatus which includes such a piezoelectric actuator.

2. Description of the Related Art

In relation to an ink-jet head described in Japanese Patent Application Laid-open No. 2006-54442, a piezoelectric actuator, which applies the pressure to the ink contained in a pressure chamber, is produced in accordance with the following procedure. At first, a vibration plate, which is composed of, for example, a stainless steel material, is joined to an upper surface of a channel unit to cover the pressure chamber therewith. A lower electrode, which serves as a diffusion-preventive layer (diffusion barrier layer), is formed on an upper surface of the vibration plate. A piezoelectric layer is formed thereon by means of the aerosol deposition method (AD method). Further, the annealing, in which the piezoelectric layer is heated at a high temperature, is performed in order that the piezoelectric layer, which is formed by the AD method, has the piezoelectric characteristic. During this procedure, constitutive atoms of the vibration plate, which are heated together with the piezoelectric layer, are diffused. However, the diffusion of the atoms is stopped at the lower electrode which serves as the diffusion-preventive layer. The constitutive atoms of the vibration plate are prevented from being diffused into the piezoelectric layer. Accordingly, the deterioration of the piezoelectric characteristic of the piezoelectric layer, which would be otherwise caused by the diffusion of the constitutive atoms of the vibration plate into the piezoelectric layer, is suppressed.

In the case of the piezoelectric actuator described in Japanese Patent Application Laid-open No. 2006-54442, the pressure is applied to the ink contained in the pressure chamber by deforming the portion (active portion) of the piezoelectric layer opposed to the pressure chamber. Therefore, the piezoelectric characteristic of the portion of the piezoelectric layer opposed to the pressure chamber affects the driving of the piezoelectric actuator. However, in the case of the ink-jet head described in Japanese Patent Application Laid-open No. 2006-54442, the vibration plate, which is composed of, for example, the stainless steel material, is arranged at the portion of the piezoelectric layer opposed to the pressure chamber. Therefore, even when the lower electrode, which serves as the diffusion-preventive layer, is arranged between the piezoelectric layer and the vibration plate, the lower electrode cannot sufficiently stop the diffusion of the constitutive atoms of the vibration plate. Therefore, the constitutive atoms of the vibration plate pass through the lower electrode, the constitutive atoms are diffused into the portion of the piezoelectric layer opposed to the pressure chamber, and the piezoelectric characteristic of the concerning portion of the piezoelectric layer is deteriorated. As a result, it is feared that the amounts of deformation of the piezoelectric layer and the vibration plate may be lowered when the piezoelectric actuator is driven.

SUMMARY OF THE INVENTION

An object of the present invention is to provide a method for producing a piezoelectric actuator which makes it possible to maximally suppress the decrease in the amounts of deformation of a piezoelectric layer and a vibration layer, and a method for producing a liquid transport apparatus which has such a piezoelectric actuator.

According to a first aspect of the present invention, there is provided a method for producing a piezoelectric actuator, including:

providing a base member;

forming a vibration layer with a ceramics material on a surface of the base member;

forming a piezoelectric layer on a surface, of the vibration layer, not facing the base member;

removing a part of the base member after forming the piezoelectric layer to form a through-hole via which the vibration layer is exposed;

forming an electrode at a portion of the piezoelectric layer to be overlapped with the through-hole; and annealing the piezoelectric layer after forming the through-hole. The base member may be formed of metal or silicon.

In the piezoelectric actuator of the present invention, the portions, of the piezoelectric layer and the vibration layer, which are opposed to the through-hole, are deformed by changing the electric potential of the electrodes. On the other hand, when the piezoelectric layer is heated to anneal, not only the piezoelectric layer but also the stacked base member are heated simultaneously. For example, when the base member is composed of metal or silicon, the constitutive atoms thereof are diffused, for example, into the piezoelectric layer, when the base member is heated at a high temperature. If the constitutive atoms of the base member are diffused into the portion (driving portion, active portion) of the piezoelectric layer facing the through-hole, then the piezoelectric characteristic is deteriorated at the active portion of the piezoelectric layer, and the amounts of deformation of the piezoelectric layer and the vibration layer, which are to be obtained when the electric potential of the electrode is changed, are consequently decreased.

However, in the present invention, the through-hole is formed for the base member before performing the heating in order to anneal the piezoelectric layer. Therefore, the constitutive atoms of the base member are hardly diffused into the portion, of the piezoelectric layer, which faces the through-hole. Therefore, the piezoelectric characteristic of the active portion of the piezoelectric layer is hardly deteriorated. It is possible to suppress the decrease in the amounts of deformation of the piezoelectric layer and the vibration layer when the electric potential of the electrode is changed.

In order to sufficiently deform the vibration layer, it is necessary that the length of the through-hole, which relates to the in-plane direction of the base member, should be increased for larger thicknesses of the vibration layer. However, when the vibration layer is formed as the film on one surface of the base member, it is possible to thin the thickness of the vibration layer, for example, as compared with a case in which any sheet to serve as the vibration layer is joined to one surface of the base member. Therefore, even when the length of the through-hole, which relates to the in-plane direction of the base member, is small, the vibration layer is sufficiently deformed. Therefore, it is possible to decrease the length of the through-hole in relation to the in-plane direction of the base member. It is possible to highly integrate the active portions in the piezoelectric actuator.

In the method for producing the piezoelectric actuator of the present invention, the piezoelectric layer may be formed by an aerosol deposition method.

When the piezoelectric layer is formed as the film by the aerosol deposition method (AD method), it is necessary to perform the annealing in which the piezoelectric layer formed as the film is heated at a high temperature in order to allow the piezoelectric layer to have the piezoelectric characteristic. The constitutive atoms of the base member are diffused by the heating. However, even in such a situation, the through-hole is formed through the base member before annealing the piezoelectric layer. Therefore, the constitutive atoms of the base member are hardly diffused into the portion, of the piezoelectric layer, which faces the through-hole. Therefore, the piezoelectric characteristic of the active portion of the piezoelectric layer is hardly deteriorated. It is possible to suppress the decrease in the amounts of deformation of the piezoelectric layer and the vibration layer when the electric potential of the electrode is changed.

In the method for producing the piezoelectric actuator of the present invention, the vibration layer may be formed by an aerosol deposition method.

When this procedure is adopted, the vibration layer, which has the densified structure or arrangement, can be formed as the film at a high speed by the AD method. When the vibration layer has the densified structure, the diffused constitutive atoms of the base member are stopped at the vibration layer when the piezoelectric layer is heated in order to perform the annealing. The constitutive atoms of the base member are hardly diffused into the piezoelectric layer. Therefore, it is possible to effectively suppress the deterioration of the piezoelectric characteristic of the piezoelectric layer.

Unlike the piezoelectric layer for which it is necessary to provide the piezoelectric characteristic, it is unnecessary to perform the annealing for the vibration layer formed by the AD method. The vibration layer formed by the AD method is solidified at the normal or ordinary temperature. Therefore, it is unnecessary to heat the vibration layer at a high temperature when the vibration layer is formed as the film. If the vibration layer is required to be heated at a high temperature (temperature higher than 600° C.) before the heating for annealing the piezoelectric layer, it is assumed that the constitutive atoms of the base member may be diffused into the portion of the vibration layer opposed to the through-hole. In this case, it is feared that the constitutive atoms of the base member, which have been diffused to the portion of the vibration layer opposed to the through-hole, may be further diffused into the piezoelectric layer during the heating to be performed for annealing the piezoelectric layer thereafter. However, when the vibration layer is formed by the AD method, it is unnecessary to heat to solidify the vibration layer. There is no fear of the further diffusion of the constitutive atoms of the base member to the piezoelectric layer as described above.

In the method for producing the piezoelectric actuator of the present invention, the through-hole may be formed by an etching. Accordingly, the through-hole can be easily formed for the base member composed of metal or silicon by means of the etching.

In the method for producing the piezoelectric actuator of the present invention, the forming of the electrode may include forming an exposed electrode which is exposed on a side, of the piezoelectric layer, not facing the vibration layer; and the forming of the exposed electrode may be performed after the forming of the through-hole.

The exposed electrode is exposed on the side of the piezoelectric layer opposite to the vibration layer. Therefore, when the through-hole is formed by the etching, if the through-hole is formed after forming the exposed electrode, then it is feared that the exposed electrode may be damaged by the etching solution. In order to avoid such an inconvenience, it is necessary to perform any extra step of, for example, masking the exposed electrode before forming the through-hole by the etching. However, in the present invention, the exposed electrode is formed after forming the through-hole. Therefore, the exposed electrode is not damaged by the etching solution, which would be otherwise damaged as described above. It is unnecessary to perform, for example, the masking treatment as described above. It is enough that the exposed electrode of the present invention is formed on the side of the piezoelectric layer opposite to the vibration layer. In this context, the present invention also includes, for example, such an embodiment that the exposed electrode is covered with, for example, any member which is not the constitutive element of the present invention, and the exposed electrode is not exposed to the outside of the actuator.

In the method for producing the piezoelectric actuator of the present invention, the forming of the electrode may be performed before the annealing of the piezoelectric layer.

For example, when the electrode is formed by the screen printing, the sputtering method, or the like, it is necessary to perform the sintering in order to fix or immobilize the formed electrode. In this procedure, when the electrode is formed before performing the heating in order to anneal the piezoelectric layer, the electrode can be simultaneously sintered when the piezoelectric layer is annealed.

In the method for producing the piezoelectric actuator of the present invention, the forming of the electrode may include sintering the electrode, and the sintering of the electrode may be performed before the forming of the through-hole and at a temperature lower than an annealing temperature to be adopted when the piezoelectric layer is annealed. Alternatively, the forming of the vibration layer may include sintering the vibration layer, and the sintering of the vibration layer may be performed before forming the through-hole and at a temperature lower than an annealing temperature to be adopted when the piezoelectric layer is annealed.

In any case, the sintering of the electrode or the vibration layer is performed before forming the through-hole for the base member, but the sintering is performed at the temperature lower than the annealing temperature for the piezoelectric layer. Therefore, the diffusion of the constitutive atoms of the base member to the piezoelectric layer is suppressed during the sintering of the electrode or the vibration layer. In order to suppress the diffusion of the constitutive atoms of the base member into the piezoelectric layer, the temperature of the sintering of the electrode or the vibration layer is preferably not more than 600° C. and more preferably not more than 500° C.

In the method for producing the piezoelectric actuator of the present invention, the electrode may be formed as a plurality of electrodes arranged on only one surface of the piezoelectric layer, and the piezoelectric layer may be polarized in an in-plane direction of the piezoelectric layer by using the plurality of electrodes. Further, the electrode may be formed as a plurality of electrodes arranged on both surfaces of the piezoelectric layer to interpose the piezoelectric layer therebetween, and a portion of the piezoelectric layer, which is interposed between the electrodes, may be polarized in a thickness direction of the piezoelectric layer. In any case, the constitutive atoms of the base member are suppressed from the diffusion into the piezoelectric layer. It is possible to enhance the piezoelectric characteristic of the piezoelectric layer.

According to a second aspect of the present invention, there is provided a method for producing a liquid transport apparatus, including:

providing a pressure chamber plate in which a pressure chamber is to be formed;

forming a vibration layer with a ceramics material on a surface of the pressure chamber plate;

forming a piezoelectric layer on a surface, of the vibration layer, not facing the pressure chamber plate;

removing a part of the pressure chamber plate after forming the piezoelectric layer to form the pressure chamber via which the vibration layer is exposed from a side, of the pressure chamber plate, not facing the vibration layer;

forming an electrode at a portion, of the piezoelectric layer, which faces the pressure chamber; and annealing the piezoelectric layer after forming the pressure chamber. The pressure chamber plate may be formed of metal or silicon.

DESCRIPTION OF THE PREFERRED EMBODIMENTS

A preferred embodiment of the present invention will be explained below.

Figure 1:
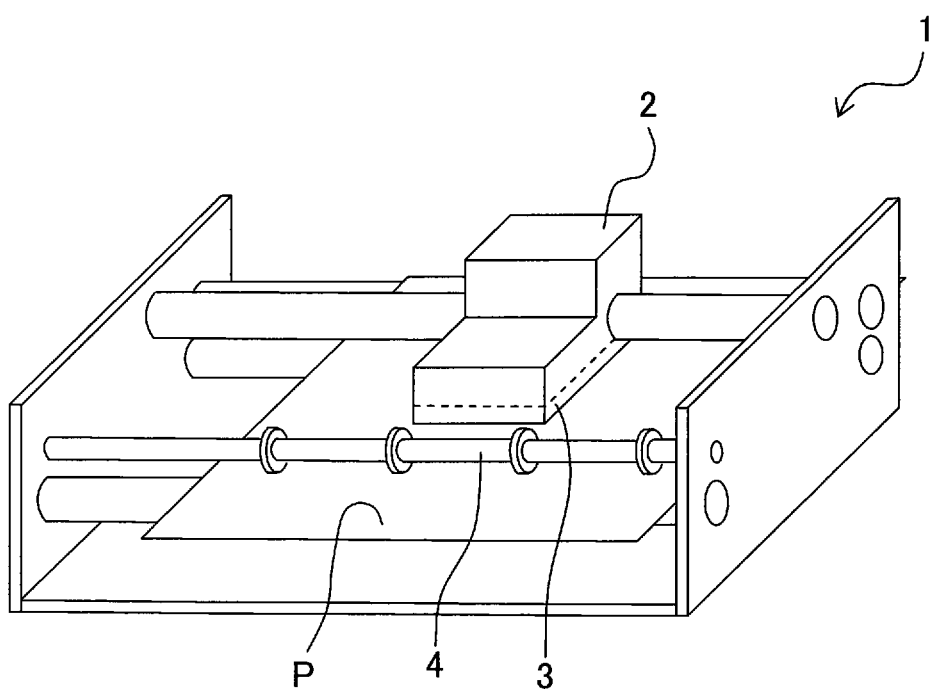
FIG. 1 shows a schematic arrangement of a printer according to an embodiment of the present invention.

FIG. 1 shows a schematic arrangement of a printer according to the embodiment of the present invention. As shown in FIG. 1, the printer 1 includes, for example, a carriage 2, an ink-jet head 3 (liquid transport apparatus), and a transport roller 4. The carriage 2 is reciprocatively movable in the scanning direction (left-right direction as viewed in FIG. 1). The ink-jet head 3 is attached to the lower surface of the carriage 2, and the ink-jet head 3 discharges the inks from a plurality of nozzles 15 (see FIG. 2) formed on the lower surface thereof while the ink-jet head 3 reciprocates in the scanning direction together with the carriage 2. The transport roller 4 transports the recording paper P in the paper feeding direction (direction directed toward the front of FIG. 1). In the printer 1, the inks are discharged to the recording paper P which is transported in the paper feeding direction by the transport roller 4, from the ink-jet head 3 which reciprocates in the scanning direction together with the carriage 2, and thus the printing is performed on the recording paper P.

Figure 2:
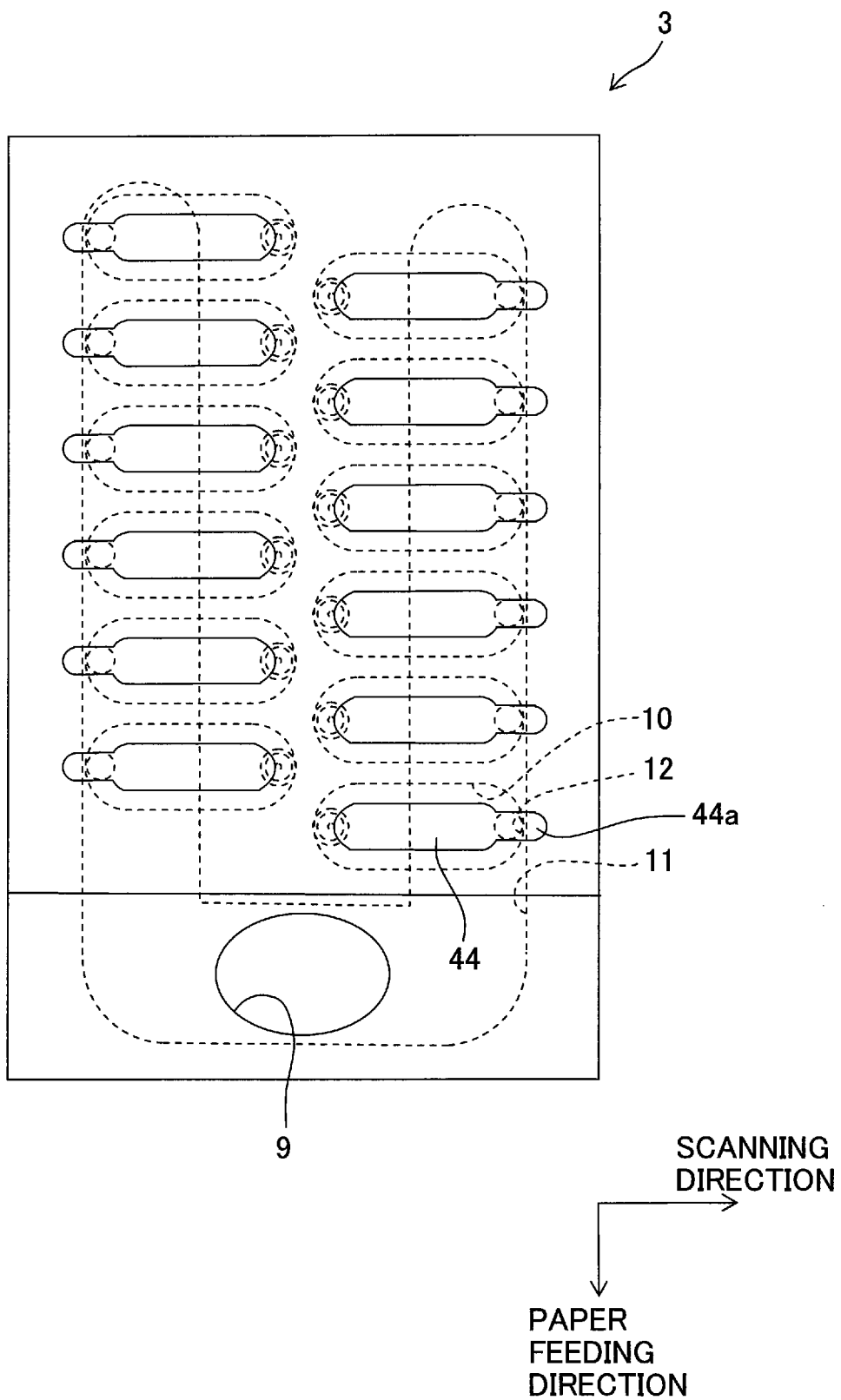
FIG. 2 shows a plan view illustrating an ink-jet head shown in FIG. 1.
Figure 3:
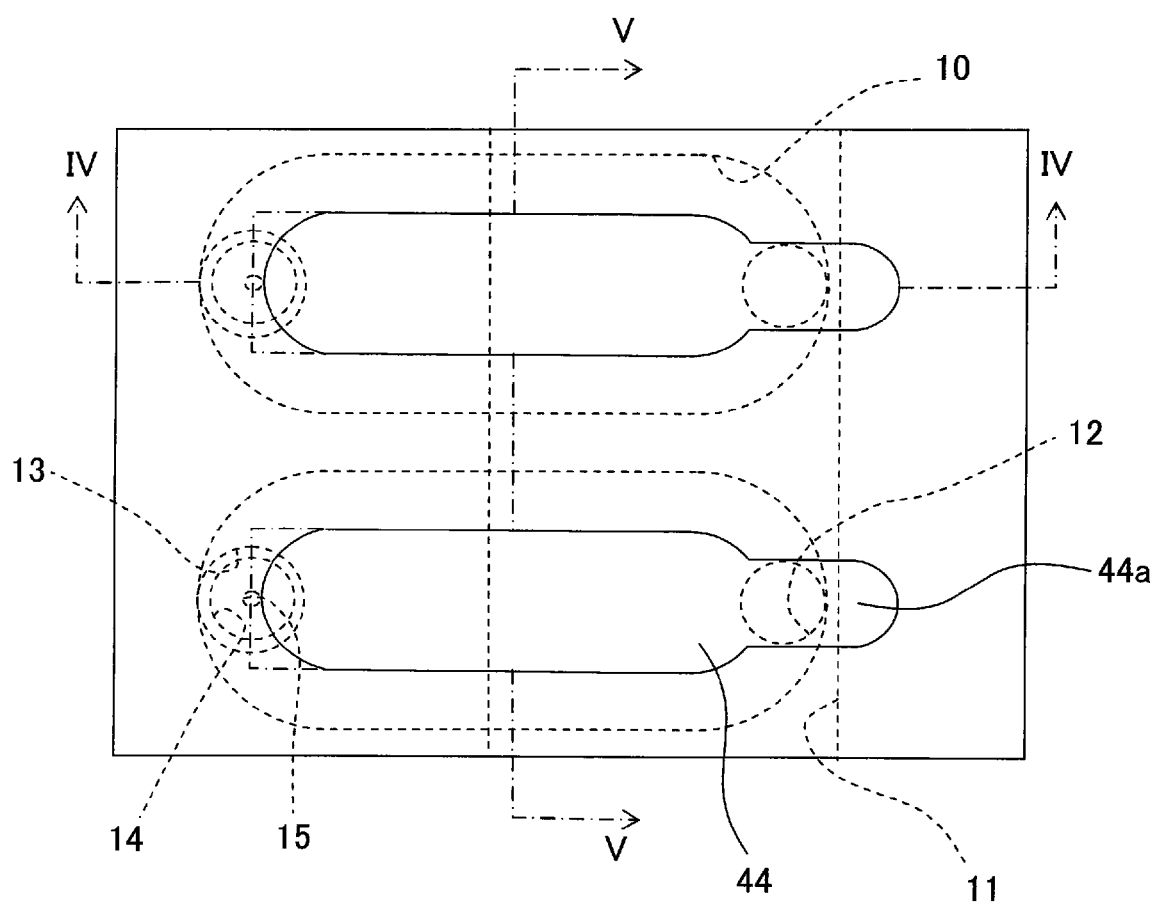
FIG. 3 shows a partial magnified view illustrating those shown in FIG. 2.
Figure 4:
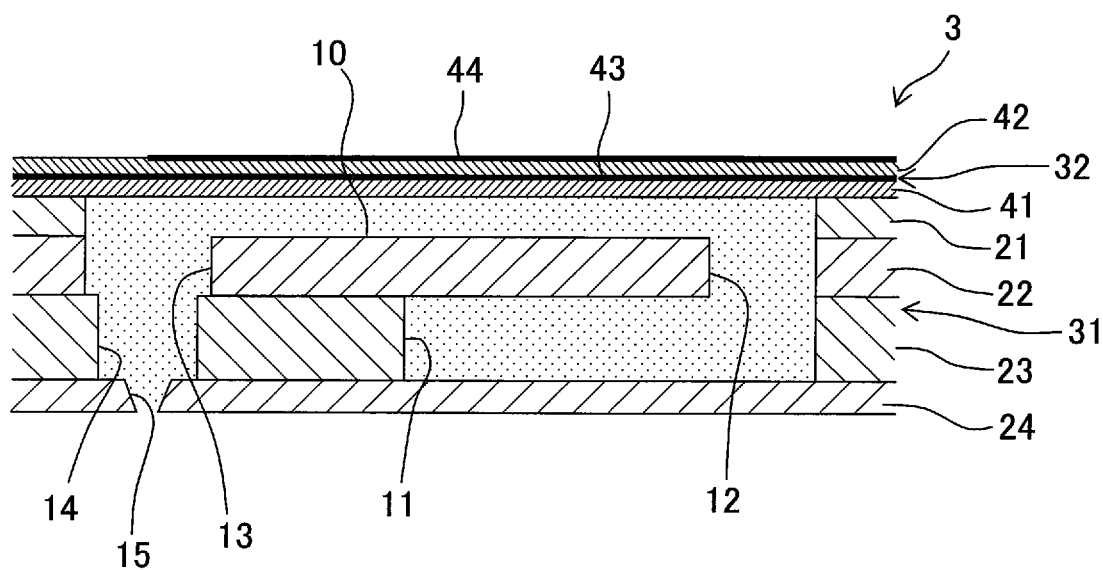
FIG. 4 shows a sectional view taken along a IV-IV line shown in FIG. 3.
Figure 5:
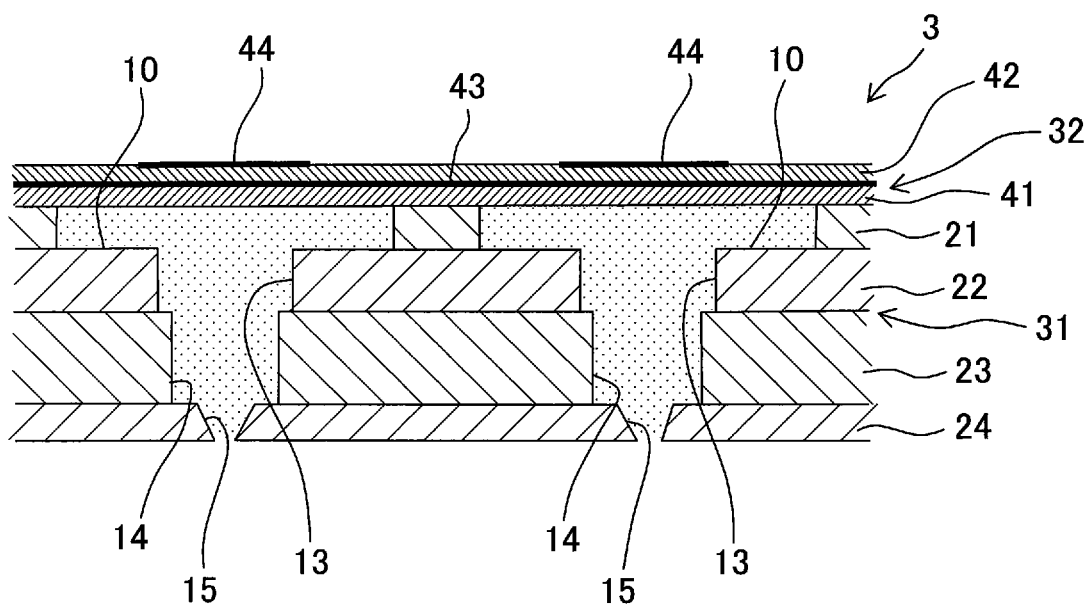
FIG. 5 shows a sectional view taken along a V-V line shown in FIG. 3.

Next, the ink-jet head 3 will be explained. FIG. 2 shows a plan view illustrating the ink-jet head 3 shown in FIG. 1. FIG. 3 shows a partial magnified view illustrating those shown in FIG. 2. FIG. 4 shows a sectional view taken along a IV-IV line shown in FIG. 3. FIG. 5 shows a sectional view taken along a V-V line shown in FIG. 3. As shown in FIGS. 2 to 5, the ink-jet head 3 includes a channel unit (flow passage unit) 31 which is formed with ink channels (flow passages) including pressure chambers 10, and a piezoelectric actuator 32 which is provided in order to apply the pressure to the ink contained in the pressure chamber 10.

The channel unit 31 is constructed by mutually stacking four plates of a cavity plate 21 (pressure chamber plate, base member), a base plate 22, a manifold plate 23, and a nozzle plate 24. The plates 21 to 24, except the nozzle plate 24, are composed of a metal material such as stainless steel. The nozzle plate 24 is composed of a synthetic resin such as polyimide. Alternatively, the nozzle plate 24 may be also composed of a metal material in the same manner as the other three plates 21 to 23.

The cavity plate 21 is formed with the plurality of pressure chambers 10. The plurality of pressure chambers 10 have substantially elliptic shapes in which the scanning direction (left-right direction as viewed in FIG. 2) is the longitudinal direction as viewed in a plan view (as viewed in the thickness direction perpendicular to the in-plane direction of the cavity plate 21). The plurality of pressure chambers 10 are formed as through-holes which penetrate through the cavity plate 21 in the thickness direction. The plurality of pressure chambers 10 form two arrays of the pressure chambers which extend in the paper feeding direction (upward-downward direction as viewed in FIG. 2) respectively. Substantially circular through-holes 12, 13 are formed respectively at positions of the base plate 22 overlapped with both ends of the pressure chambers 10 in relation to the longitudinal direction as viewed in a plan view.

The manifold plate 23 is formed with a manifold channel (manifold) 11. A part of the manifold channel (extending portions of the manifold channel) extends in two arrays in the paper feeding direction along the arrays of the pressure chambers 10 and a part of the manifold channel (a connecting portion of the manifold channel) extends in the scanning direction at the lower end as shown in FIG. 2 so that the extending portions, which extend in the paper feeding direction, are connected to one another. The extending portions of the manifold channel 11, which extend in the two arrays in the paper feeding direction as described above, are arranged to be overlapped with substantially right halves of the plurality of pressure chambers 10 arranged on the right side as shown in FIG. 2 as viewed in a plan view and substantially left halves of the plurality of pressure chambers 10 arranged on the left side as shown in FIG. 2 respectively. The ink is supplied to the manifold channel 11 from an ink supply port 9 which is formed at the lower end (at the connecting portion) as shown in FIG. 2. Substantially circular through-holes 14 are formed at portions of the manifold plate 23 overlapped with the through-holes 13 as viewed in a plan view. Nozzles 15 are formed at portions of the nozzle plate 24 overlapped with the through-holes 14 as viewed in a plan view.

The manifold channel 11 is communicated with the pressure chambers 10 via the through-holes 12. Each of the pressure chambers 10 is communicated with one of the nozzles 15 via one of the through-holes 13, 14. In this way, a plurality of individual ink channels are formed from the outlets of the manifold channel 11 via the pressure chambers 10 to arrive at the nozzles 15.

The piezoelectric actuator 32 includes a vibration layer 41, a piezoelectric layer (layer including a piezoelectric material) 42, a common electrode 43, and a plurality of individual electrodes 44. The vibration layer 41 is formed of a ceramics material such as alumina or zirconia. The vibration layer 41 is arranged on the upper surface of the cavity plate 21 so that the plurality of pressure chambers 10 are covered therewith.

The piezoelectric layer 42 is a layer which includes the piezoelectric material containing a major component of lead titanate zirconate as a mixed crystal of lead titanate and lead zirconate. The piezoelectric layer 42 is arranged continuously to range over (to cover) the plurality of pressure chambers 10 on the upper surface of the vibration layer 41 (on the side opposite to the cavity plate 21). The piezoelectric layer 42 is previously polarized in the thickness direction thereof.

The common electrode 43 is formed of, for example, platinum, palladium, gold, or silver. The common electrode 43 is arranged to range over the substantially entire region between the vibration layer 41 and the piezoelectric layer 42. The common electrode 43 is connected to an unillustrated driver IC via an unillustrated flexible printed circuit (FPC). The common electrode 43 is always retained at the ground electric potential by the driver IC.

The plurality of individual electrodes 44 (exposed electrodes) are formed of a material which is the same as or equivalent to that of the common electrode 43. The plurality of individual electrodes 44 (exposed electrodes) are arranged on the upper surface of the piezoelectric layer 42 (on the side opposite to the vibration layer 41) corresponding to the plurality of pressure chambers 10. The plurality of individual electrodes 44 (exposed electrodes) are exposed on the upper surface of the piezoelectric layer 42. The individual electrodes 44 have substantially elliptic shapes, as viewed in a plan view, which are one size smaller than the pressure chambers 10. The individual electrodes 44 are arranged at portions of the upper surface of the piezoelectric layer 42 overlapped with substantially central portions of the pressure chambers 10 as viewed in a plan view. An end of the individual electrode 44, which is disposed on the side opposite to the nozzle 15 in the longitudinal direction, is extracted in the scanning direction to extend to a portion of the upper surface of the piezoelectric layer 42 not opposed to the pressure chamber 10. The forward end thereof is a connecting terminal 44a to be connected to unillustrated FPC. The driving electric potential is selectively applied to the plurality of individual electrodes 44 by the unillustrated driver IC through the FPC.

A method for driving the piezoelectric actuator 32 will now be explained. The plurality of individual electrodes 32 are previously retained at the ground electric potential in the piezoelectric actuator 32. When the piezoelectric actuator 32 is driven, the driving electric potential is selectively applied to any one of the plurality of individual electrodes 44. Accordingly, the electric potential difference is generated between the individual electrode 44 of the piezoelectric layer 42 to which the driving electric potential is applied and the common electrode 43 which is retained at the ground electric potential. The electric field in the thickness direction is generated at the active portions of the piezoelectric layer 42 interposed between these electrodes.

The direction of the electric field is coincident with the direction of polarization of the piezoelectric layer 42. Therefore, the portion (active portion) of the piezoelectric layer 42, which is opposed to the pressure chamber 10, is shrunk in the horizontal direction perpendicular to the direction of the electric field. In accordance therewith, the portions of the piezoelectric layer 42 and the vibration layer 41, which are opposed to the pressure chamber 10, are deformed so that they protrude toward the pressure chamber 10 as a whole. Accordingly, the volume of the pressure chamber 10 is lowered (decreased), and the pressure of the ink contained in the pressure chamber 10 is raised (pressure is applied to the ink contained in the pressure chamber 10). The ink is discharged from the nozzle 15 communicated with the pressure chamber 10.

Figure 6:
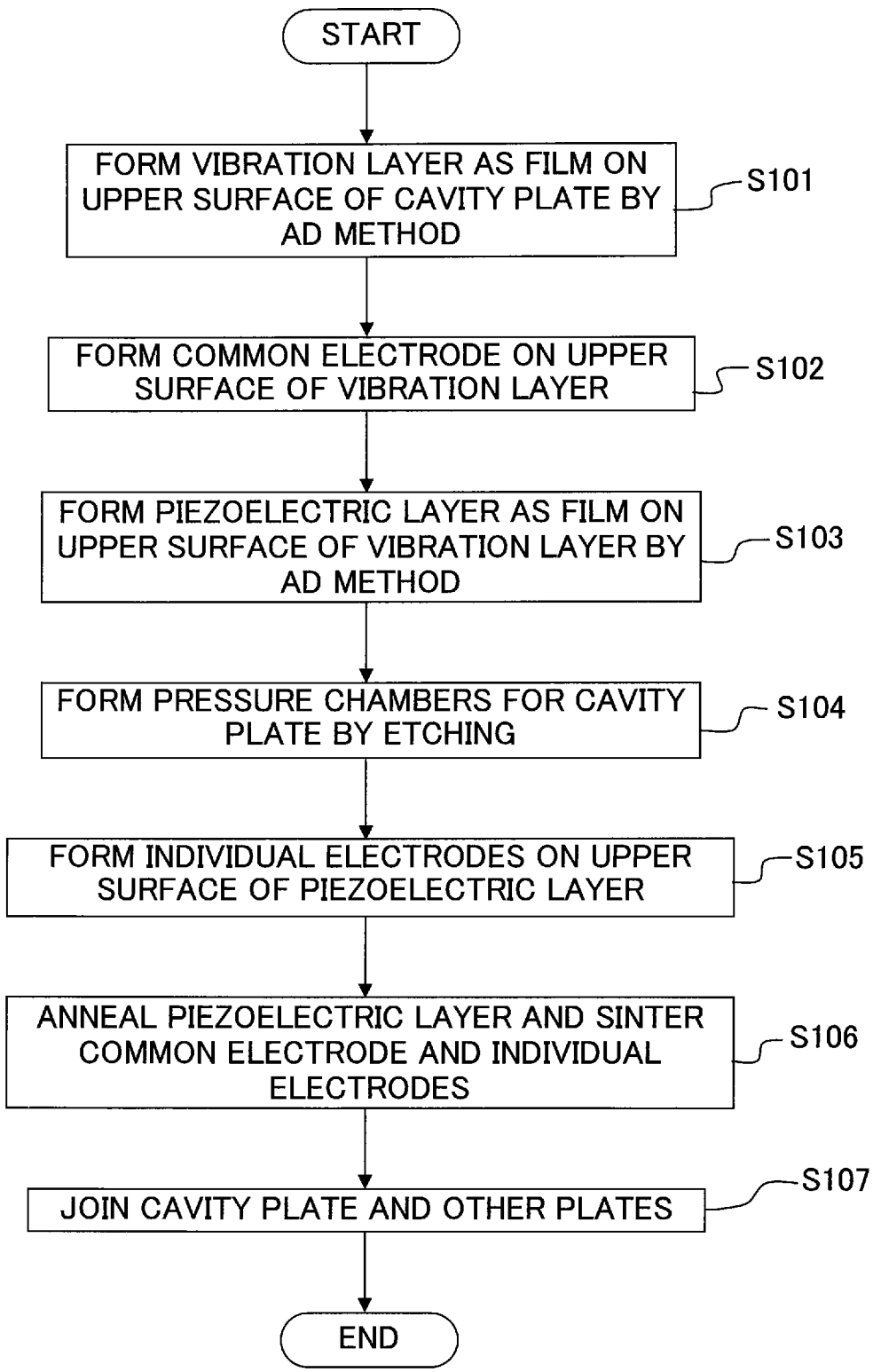
FIG. 6 shows a flow chart illustrating the process for producing the ink-jet head (piezoelectric actuator).

Next, a method for producing the ink-jet head 3 (piezoelectric actuator 32) will be explained. FIG. 6 shows a flow chart illustrating the steps of producing the ink-jet head 3. FIG. 7 shows the steps to illustrate states of the ink-jet head 3 in the respective steps of the production.

Figure 7A:
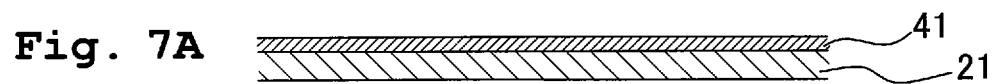
FIGS. 7A to 7E show states of the ink-jet head in respective steps of the production.

When the ink-jet head 3 (piezoelectric actuator 32) is produced, at first, as shown in FIGS. 6 and 7A, the vibration layer 41 is formed as the film by means of the aerosol deposition method (AD method) in which the aerosol containing fine particles of the ceramics material is allowed to blow against the upper surface (one surface) of the cavity plate 21 (base member) before forming the pressure chambers 10 (Step S101, hereinafter simply referred to, for example, as "S101": vibration layer-forming step). When the vibration layer 41 is formed by the AD method as described above, then the vibration layer 41 has the densified structure, and it is possible to thin the thickness thereof.

In this arrangement, in order to sufficiently deform the vibration layer 41 when the piezoelectric actuator 32 is driven as described above, it is necessary that the lengths of the pressure chamber 10, which relate to the scanning direction and the paper feeding direction (in-plane direction of the cavity plate 21), should be increased for larger thicknesses of the vibration layer 41.

The thin vibration layer 41 is formed as the film by means of the AD method as in this embodiment. Therefore, the vibration layer 41 is sufficiently deformed when the piezoelectric actuator 32 is driven, even when the lengths of the pressure chamber 10, which relate to the scanning direction and the paper feeding direction, are small. Therefore, it is possible to highly integrate the pressure chambers 10 and the driving portions of the piezoelectric actuator 32 (portions opposed to the pressure chambers 10).

Figure 7B:
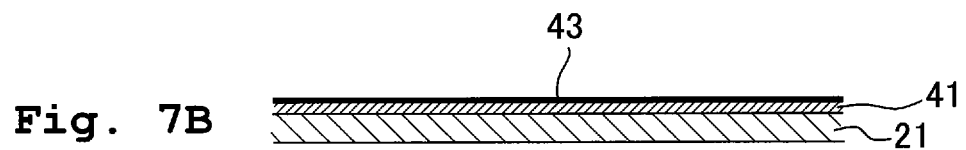
Figure 7C:
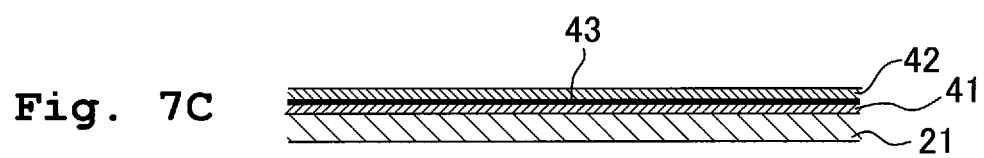

Subsequently, as shown in FIGS. 6 and 7B, the common electrode 43 is formed on the upper surface of the vibration layer 41, for example, by means of the screen printing or the sputtering method (S102). Subsequently, as shown in FIGS. 6 and 7C, the piezoelectric layer 42 is formed as the film on the upper surface of the vibration layer 41 on which the common electrode 43 has been formed (on the side opposite to the cavity plate 21) by means of the AD method in which the film is formed such that the aerosol containing the fine particles of the piezoelectric material is allowed to blow (S103: piezoelectric layer-forming step).

Figure 7D:
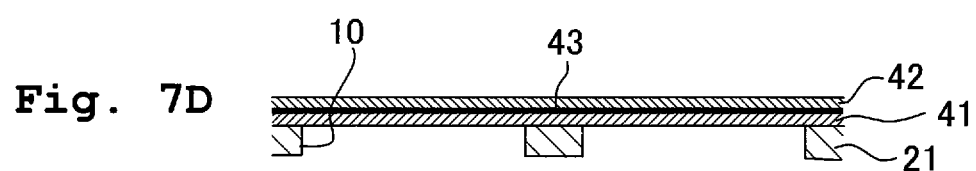

Subsequently, as shown in FIGS. 6 and 7D, parts of the cavity plate 21 are removed, and thus the pressure chambers 10 (through-holes), which penetrate through the cavity plate 21 in the thickness direction thereof and which are capable of facing the vibration layer 41 from the lower positions (from the side of the cavity plate 21 opposite to the vibration layer 41), are formed for the cavity plate 21 (S104: through-hole-forming step, pressure chamber-forming step). In this arrangement, the cavity plate 21 is formed of the metal material such as stainless steel. Therefore, the pressure chambers 10 can be formed with ease by means of the etching.

Figure 7E:
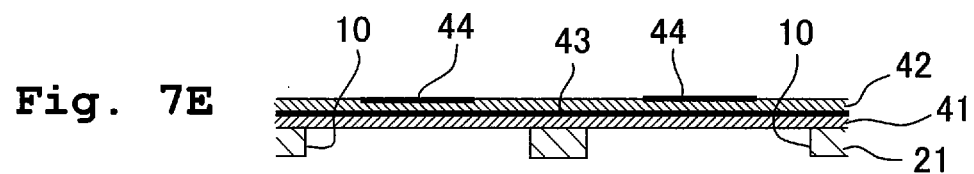

Subsequently, as shown in FIGS. 6 and 7E, the plurality of individual electrodes 44 are formed on the upper surface of the piezoelectric layer 42, for example, by means of the screen printing or the sputtering method (S105: exposed electrode-forming step).

Contrary to the embodiment of the present invention, it is also possible to form the pressure chambers 10 for the cavity plate 21 by means of the etching after forming the plurality of individual electrodes 44 on the upper surface of the piezoelectric layer 42. However, in this procedure, the individual electrodes 44 are exposed on the upper surface of the vibration layer 42. Therefore, the etching solution is stuck to the individual electrodes 44 when the pressure chambers 10 are formed for the cavity plate 21 by means of the etching. It is feared that the individual electrodes 44 may be damaged. Further, in order to avoid this inconvenience, it is necessary to perform any extra step, for example, such that the individual electrodes 44 are masked before forming the pressure chambers 10 by means of the etching.

On the contrary, in the embodiment of the present invention, the individual electrodes 44 are formed after forming the pressure chambers 10. In other words, the exposed electrode-forming step is performed after the through-hole-forming step. Therefore, the individual electrodes 44 are not damaged by the etching solution, and it is also unnecessary, for example, to mask the individual electrodes 44. Therefore, the production steps are simplified corresponding thereto. The combination of the step of forming the common electrode described above and the step of forming the individual electrodes 44 corresponds to the electrode-forming step of forming the electrodes at the portions of the piezoelectric layer 42 opposed to at least the pressure chambers 10.

Subsequently, the stack of the cavity plate 21, the vibration layer 41, the common electrode 43, the piezoelectric layer 42, and the plurality of individual electrodes 44 is heated at a predetermined annealing temperature (for example, about 850° C.) (S106: heating step). Accordingly, the annealing is performed, in which the heating is effected at the high temperature in order to provide the piezoelectric characteristic for the piezoelectric layer 42 formed by the AD method. Further, the common electrode 43 and the individual electrodes 44 are sintered. The annealing of the piezoelectric layer is performed in order that the crystal grain size of the piezoelectric material is increased to increase the piezoelectric constant. The sintering of the electrode is performed in order that the surfaces of the metal particles to serve as the material for the electrode are fixed or immobilized to the surface of the substrate (for example, the piezoelectric layer and the vibration layer) while bonding the surfaces of the metal particles to one another. The "annealing" and the "sintering" are distinctly distinguished from each other.

In this situation, the constitutive atoms of the cavity plate 21 (for example, Cr atoms when the cavity plate 21 is composed of stainless steel) are diffused toward the vibration layer 41 and the piezoelectric layer 42 in accordance with the heating described above. When the constitutive atoms of the cavity plate 21 are diffused into the portions of the piezoelectric layer 42 opposed to the pressure chambers 10, the piezoelectric characteristic is deteriorated at the concerning portions of the piezoelectric layer 42. As a result, the amounts of deformation, of the piezoelectric layer 42 and the vibration layer 41, which are obtained when the piezoelectric actuator 32 is driven, are decreased. The discharge characteristic of the ink discharged from the nozzles 15 is deteriorated.

However, in the embodiment of the present invention, the pressure chambers 10 are formed through the cavity plate 21 by means of the etching before performing the heating. As described above, the pressure chambers 10 are formed as the through-holes in the cavity plate 21. Therefore, the area of the piezoelectric layer 42, which is overlapped with the pressure chambers 10, is not overlapped with the metal plate which constitutes the cavity plate 21. Therefore, even if the constitutive atoms of the cavity plate 21 are diffused toward the vibration layer 41 and the piezoelectric layer 42, the constitutive atoms are hardly diffused into the portions of the piezoelectric layer 42 opposed to the pressure chambers 10. Therefore, it is possible to suppress the deterioration of the piezoelectric characteristic of the portions of the piezoelectric layer 42 opposed to the pressure chambers 10, and it is possible to suppress the decrease in the amounts of deformation of the piezoelectric layer 42 and the vibration layer 41 when the piezoelectric actuator 32 is driven.

The vibration layer 41 of the ceramics material is formed by the AD method between the upper surface of the cavity plate 21 and the piezoelectric layer 42 as described above. In this way, the vibration layer 41 is formed by the AD method, and hence the vibration layer 41 has the densified structure. The constitutive atoms, which are diffused from the cavity plate 21, are stopped by the vibration layer 41, and the constitutive atoms are hardly diffused to the piezoelectric layer 42. Accordingly, the decrease in the piezoelectric characteristic is further suppressed at the portions of the piezoelectric layer 42 overlapped with the pressure chambers.

In the embodiment of the present invention, the heating step described above is performed after forming the common electrode 43 and the plurality of individual electrodes 44. In this way, the electrode-forming step is performed before the heating step. Therefore, it is possible to simultaneously perform the annealing of the piezoelectric layer 42 and the sintering of the common electrode 43 and the individual electrodes 44.

After that, the cavity plate 21 is mutually joined to the base plate 22, the manifold plate 23, and the nozzle plate 24 which are previously manufactured (S107). Accordingly, the ink-jet head 3 is completed. It is necessary to perform the polarizing step in order to polarize the piezoelectric layer after the heating step (S106). The portion (active portion) of the piezoelectric layer, which is interposed between the common electrode 43 and the individual electrodes 44, is polarized in the thickness direction, for example, by retaining the common electrode 43 at the ground electric potential and allowing the individual electrode 44 to have an electric potential higher than the driving electric potential.

In relation to the embodiment explained above, when the piezoelectric layer 42 is formed by the AD method, it is necessary to perform the annealing in which the piezoelectric layer 42 is heated at the high temperature in order to allow the piezoelectric layer 42 to have the piezoelectric characteristic. In this situation, the constitutive atoms of the cavity plate 21 to be heated together with the piezoelectric layer 42 are diffused toward the vibration layer 41 and the piezoelectric layer 42.

However, in the embodiment of the present invention, the parts of the cavity plate 21 are removed to form the pressure chambers 10 before heating the stack of the cavity plate 21, the vibration layer 41, the common electrode 43, the piezoelectric layer 42, and the individual electrodes 44. In other words, the area of the piezoelectric layer, which serves as the active portion, is not overlapped with the metal portion of the cavity plate 21. Therefore, even when the constitutive atoms of the cavity plate 21 are diffused by the heating to be performed thereafter, the constitutive atoms of the cavity plate 21 are hardly diffused to the portions of the piezoelectric layer 42 opposed to the pressure chambers 10. Accordingly, it is possible to suppress the deterioration of the piezoelectric characteristic of the area of the piezoelectric layer 42 to serve as the active portion.

In the embodiment of the present invention, the vibration layer 41 is formed as the film by the AD method. Therefore, the vibration layer 41, which has the densified structure, can be formed as the film at a high speed. Owing to the fact that the vibration layer 41, which is arranged between the cavity plate 21 and the piezoelectric layer 42, has the densified structure, the constitutive atoms of the cavity plate 21, which are diffused during the heating (annealing of the piezoelectric layer), are stopped at the vibration layer 41, and the constitutive atoms of the cavity plate 21 are hardly diffused to the piezoelectric layer 42. Therefore, it is possible to effectively suppress the deterioration of the piezoelectric characteristic of the portions of the piezoelectric layer 42 opposed to the pressure chambers 10.

In order to sufficiently deform the vibration layer 41 when the piezoelectric actuator 32 is driven, it is necessary to increase the lengths of the pressure chambers 10 in the scanning direction and/or the paper feeding direction for larger thicknesses of the vibration layer 41. In the embodiment of the present invention, the vibration layer 41 is formed as the film by the AD method, and hence the vibration layer 41 can be thinned. Therefore, even when the lengths of the pressure chambers 10 in the scanning direction and/or the paper feeding direction are small, it is possible to sufficiently deform the vibration layer 41. Therefore, it is possible to highly integrate the pressure chambers 10 and driving portions of the piezoelectric actuator 32 opposed to the pressure chambers 10. Here, the driving portions of the piezoelectric actuator 32 includes one of the individual electrodes 44, the common electrode 43, and one of the active portions of the piezoelectric layer which is located between the electrodes 43, 44.

The cavity plate 21 is formed of the metal material such as stainless steel. Therefore, the pressure chambers 10 can be easily formed for the cavity plate 21 by the etching.

The individual electrodes 44 are formed on the upper surface of the piezoelectric layer 42 after forming the pressure chambers 10 for the cavity plate 21 by the etching. Therefore, the individual electrodes 44 are not damaged, which would be otherwise damaged such that the etching solution is stuck to the individual electrodes 44 when the pressure chambers 10 are formed. Accordingly, it is unnecessary to perform any extra step of masking the individual electrodes 44 before performing the etching.

In the embodiment of the present invention, the stack of the cavity plate 21, the vibration layer 41, the common electrode 43, the piezoelectric layer 42, and the individual electrodes 44 is heated after forming the individual electrodes 44. Therefore, the annealing of the piezoelectric layer 42 and the sintering of the individual electrodes 44 and the common electrode 43 can be simultaneously performed.

Next, modified embodiments, in which various modifications are applied to the embodiment of the present invention, will be explained. However, those constructed in the same manner as those of the embodiment of the present invention are designated by the same reference numerals, any explanation of which will be appropriately omitted.

In the embodiment of the present invention, the piezoelectric layer 42 is formed as the film by the AD method. However, the piezoelectric layer 42 can be also formed by any other method. Specifically, for example, the piezoelectric layer 42 may be formed as a film such that a slurry in a form of liquid, which is prepared by mixing a solvent with a raw material powder composed of a piezoelectric material and a sintering-auxiliary (a sintering aid) such as glass, an organic binder, and a plasticizer, is applied to the upper surface of the vibration layer 41 formed with the common electrode 43. In this procedure, it is necessary to sinter (solidify) the piezoelectric layer 42 after applying the slurry.

In the embodiment described above, the piezoelectric layer 42 is formed by the AD method. The vibration layer 41 and the piezoelectric layer 42, which are formed as the films by the AD method, are solidified at the normal or ordinary temperature. Therefore, it is unnecessary to perform the sintering of the piezoelectric layer. In the embodiment described above, the annealing treatment is performed, in which the piezoelectric layer 42 is heated at the high temperature. However, as described above, the annealing of the piezoelectric layer is the treatment to allow the piezoelectric layer to have the piezoelectric characteristic, which is not the treatment to solidify the piezoelectric layer.

When the piezoelectric layer is formed as the film by applying the slurry, the stack of the cavity plate 21, the vibration layer 41, the common electrode 43, the piezoelectric layer 42, and the individual electrodes 44 is heated at a high temperature (for example, not less than 850° C.) in order to sinter (solidify) the piezoelectric layer 42 and anneal the piezoelectric layer 42 after applying the slurry. In this procedure, the piezoelectric layer is simultaneously sintered as well by annealing the piezoelectric layer without distinctly perform the sintering of the piezoelectric layer. Also in this case, the constitutive atoms of the cavity plate 21 are diffused when the piezoelectric layer 42 is heated. However, the piezoelectric layer 42 is heated after forming the pressure chambers 10 for the cavity plate 21 in the same manner as in the embodiment. Therefore, the constitutive atoms of the cavity plate 21 are hardly diffused into the portions of the piezoelectric layer 42 opposed to the pressure chambers 10.

In the embodiment of the present invention, the vibration layer 41 is also formed as the film by the AD method. However, the vibration layer 41 can be formed as the film by any other method. When the vibration layer 41 is formed by the AD method as in the embodiment described above, the vibration layer 41, which has been formed as the film, can be solidified at the normal temperature. Therefore, there is no fear of the diffusion of the constitutive atoms from the base member 21 when the vibration layer 41 is solidified. However, the vibration layer 41 can be also formed as a film by any method including, for example, the sol-gel method, the sputtering method, the CVD method (chemical vapor deposition method), and the hydrothermal method without being limited to the AD method, provided that the vibration layer 41 can be solidified at a low temperature of such an extent that the constitutive atoms are not diffused from the cavity plate 21.

In this procedure, it is necessary to solidify the vibration layer 41 in order to form, for example, the common electrode 43 on the upper surface after forming the vibration layer 41. Further, the pressure chambers (through-holes) 10 cannot be formed for the cavity plate 21 before solidifying the vibration layer 41. If the stack of the cavity plate 21 and the vibration layer 41 is heated at a high temperature to such an extent that the constitutive atoms of the cavity plate 21 are diffused, in order to solidify the vibration layer 41, the constitutive atoms of the cavity plate 21 are diffused into the entire region of the vibration layer 41 during the heating. In other words, the constitutive atoms of the cavity plate 21 are also diffused into the portions of the vibration layer 41 to be overlapped with the pressure chambers 10. Therefore, when the pressure chambers 10 are formed for the cavity plate 21 thereafter, and the heating is performed in order to perform the annealing for the piezoelectric layer 42, then it is feared that the constitutive atoms of the cavity plate 21, which have been diffused into the portions of the vibration layer 41 overlapped with the pressure chambers 10, may be further diffused from the vibration layer 41 to the portions of the piezoelectric layer 42 overlapped with the pressure chambers 10, and the piezoelectric characteristic may be deteriorated at the portions of the piezoelectric layer 42 overlapped with the pressure chambers 10.

Therefore, it is preferable that the vibration layer 41 is formed as the film by using any method which makes it possible to effect the solidification at a low temperature to such an extent that the constitutive atoms of the cavity plate 21 are not diffused.

In the embodiment of the present invention, the pressure chambers 10 are formed for the cavity plate 21, and then the individual electrodes 44 are formed on the upper surface of the piezoelectric layer 42. However, the individual electrodes 44 may be formed on the upper surface of the piezoelectric layer 42, and then the pressure chambers 10 may be formed for the cavity plate 21. In this procedure, in order to avoid any damage of the individual electrodes 44 caused by the etching solution, the individual electrodes 44 may be masked before forming the pressure chambers 10 for the cavity plate 21 by the etching.

In the embodiment of the present invention, the individual electrodes 44 are formed, and then the stack of the cavity plate 21, the vibration layer 41, the common electrode 43, the piezoelectric layer 42, and the individual electrodes 44 is heated to simultaneously perform the annealing of the piezoelectric layer 42 and the sintering of the electrodes (individual electrodes 44 and common electrode 43). However, the present invention is not limited thereto. For example, the stack of the cavity plate 21, the vibration layer 41, the common electrode 43, and the piezoelectric layer 42 may be heated to anneal the piezoelectric layer 42 and sinter the common electrode 43 before forming the individual electrodes 44 after forming the pressure chambers 10 for the cavity plate 21, and then the individual electrodes 44 may be formed on the upper surface of the piezoelectric layer 42. The stack stacked with the individual electrodes 44 may be heated distinctly from the above in order to sinter the formed individual electrodes 44.

If the sintering of the electrode (for example, the individual electrode and/or the common electrode) or the sintering of the vibration layer is performed distinctly from the annealing of the piezoelectric layer, the sintering step can be also performed before the through-holes, which serve as the pressure chambers, are formed for the cavity plate. However, in order to avoid the diffusion of the metal atoms or the like from the cavity plate into the piezoelectric layer and the deterioration of the piezoelectric characteristic of the piezoelectric layer, it is necessary to perform the sintering at a temperature which is lower than at least the annealing temperature. Specifically, it is preferable to sinter, for example, the electrodes and the vibration layer at a temperature of not more than 600° C., for the following reason. That is, according to the knowledge of the present inventors, if the heating is effected to a high temperature exceeding 600° C., then the diffusion of the metal atoms or the like is conspicuous, and it is seriously feared that the piezoelectric characteristic of the piezoelectric layer may be deteriorated. It is more preferable to sinter, for example, the electrodes and the vibration layer at a temperature of not more than 500° C., for the following reason. That is, according to the knowledge of the present inventors, even if the heating is effected to a low temperature of not more than 500° C., then the influence of the diffusion of the metal atoms or the like is small, and it is scarcely feared that the piezoelectric characteristic of the piezoelectric layer may be deteriorated.

The present invention is not limited to the arrangement in which the cavity plate is formed of the metal material such as stainless steel. The cavity plate may be formed of silicon. When the atoms of silicon are diffused into the piezoelectric layer 42, the piezoelectric characteristic of the piezoelectric layer 42 is also deteriorated. However, even when the cavity plate 21 is formed of silicon, parts of the cavity plate 21 are removed to form the pressure chambers 10 before performing the heating. Therefore, the atoms of silicon are hardly diffused into the portions of the piezoelectric layer 42 opposed to the pressure chamber 10 in the same manner as in the embodiment. Further, when the base member, which is to serve as the cavity plate, is composed of silicon, the pressure chambers can be also formed for the base member by means of the etching with ease.

Figure 8:
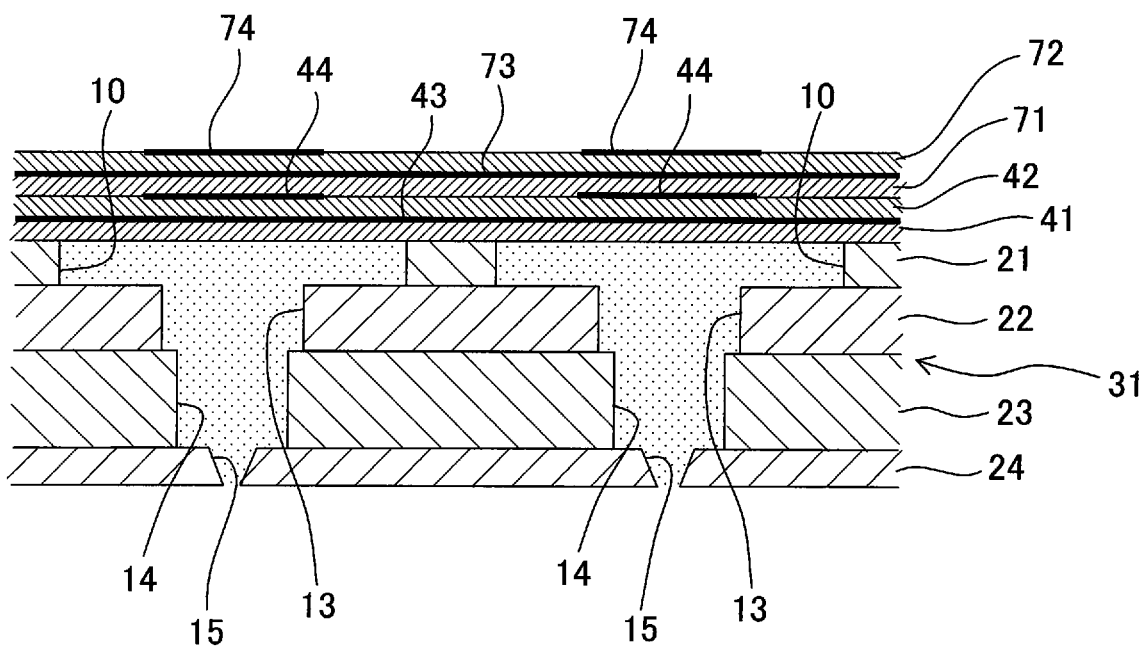
FIG. 8 shows a first modified embodiment as corresponding to FIG. 5.

In the embodiment of the present invention, only one layer of the piezoelectric layer 42 is formed on the upper surface of the vibration layer 41. However, the present invention is not limited thereto. In a first modified embodiment, as shown in FIG. 8, piezoelectric layers 71, 72 are further arranged on the upper surface of the piezoelectric layer 42. A common electrode 73, which covers the substantially entire regions of the piezoelectric layers 71, 72 (which covers all of the pressure chambers), is arranged between the piezoelectric layer 71 and the piezoelectric layer 72, and individual electrodes 74 (exposed electrodes), which have the same or equivalent shapes as the shapes of the individual electrodes 44, are arranged at portions of the upper surface of the piezoelectric layer 72 (on the side opposite to the vibration layer 41) overlapped with the pressure chambers 10. In this arrangement, the combination of the piezoelectric layers 42, 71, 72 corresponds to the piezoelectric layer according to the present invention. In this embodiment, unlike the embodiment described above, the individual electrodes 44 do not correspond to the exposed electrodes according to the present invention.

Figure 9A:
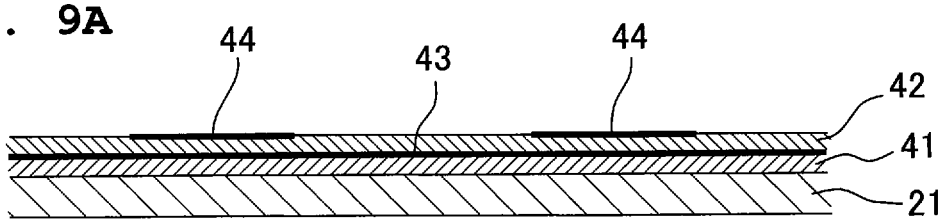
FIGS. 9A to 9F show states of an ink-jet head in respective steps of the production of the ink-jet head in the first modified embodiment.
Figure 9B:
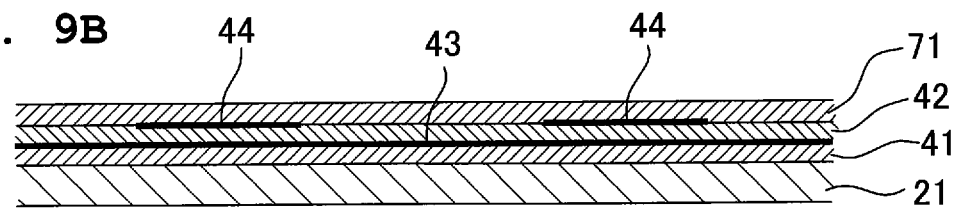
Figure 9C:
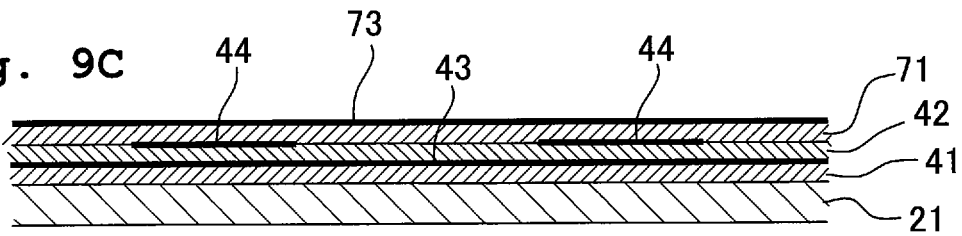
Figure 9D:
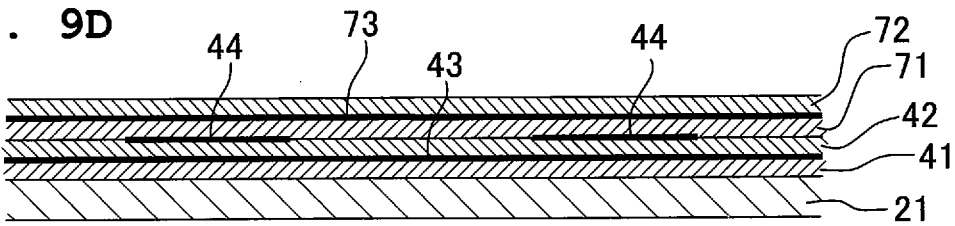

When such an ink-jet head is produced, the following procedure is adopted in the same manner as in the embodiment of the present invention. That is, the vibration layer 41, the common electrode 43, and the piezoelectric layer 42 are formed on the upper surface of the cavity plate 21 before forming the pressure chambers 10 as shown in FIGS. 7A to 7C, and then the individual electrodes 44 are formed on the upper surface of the piezoelectric layer 42 as shown in FIG. 9A. Subsequently, the piezoelectric layer 71 is formed as the film on the upper surface of the piezoelectric layer 42 as shown in FIG. 9B. Subsequently, the common electrode 73 is formed on the upper surface of the piezoelectric layer 71 as shown in FIG. 9C, and then the piezoelectric layer 72 is formed on the upper surface of the piezoelectric layer 71 as shown in FIG. 9D. The piezoelectric layers 71, 72 are formed as the films by the AD method in the same manner as the piezoelectric layer 42. The common electrode 73 is formed, for example, by the screen printing or the sputtering method in the same manner as the common electrode 43.

Figure 9E:
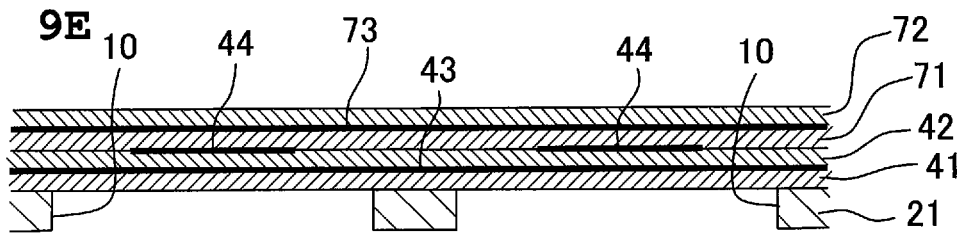
Figure 9F:
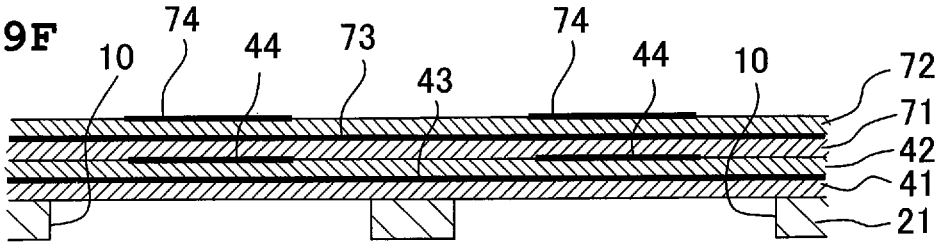

Subsequently, the pressure chambers 10 are formed for the cavity plate 21 by the etching (through-hole-forming step, pressure chamber-forming step) as shown in FIG. 9E in the same manner as in the embodiment of the present invention, and then the individual electrodes 74 are formed, for example, by the screen printing or the sputtering method on the upper surface of the piezoelectric layer 72 (exposed electrode-forming step) as shown in FIG. 9F. After that, the stack of the cavity plate 21, the vibration layer 41, the piezoelectric layers 42, 71, 72, the common electrodes 43, 73, and the individual electrodes 44, 74 is heated to anneal the piezoelectric layers 42, 71, 72 and sinter the common electrodes 43, 73 and the individual electrodes 44, 74 (heating step).

In this case, the combination of the steps of forming the films of the piezoelectric layers 42, 71, 72 corresponds to the piezoelectric layer-forming step according to the present invention, and the combination of the steps of forming the common electrodes 43, 73 and the individual electrodes 44, 74 corresponds to the electrode-forming step according to the present invention.

Even in this case, the individual electrodes 74 are formed after forming the pressure chambers 10 for the cavity plate 21 by the etching. Therefore, the individual electrodes 74 are not damaged by the etching solution. Further, the heating step is performed after forming the individual electrodes 74. Therefore, the individual electrodes 74 can be sintered simultaneously with the annealing of the piezoelectric layers 42, 71, 72 and the sintering of the common electrodes 43, 73 and the individual electrodes 44.

In the embodiment of the present invention, the common electrode 43 is arranged on the lower surface of the piezoelectric layer 42 in the piezoelectric actuator 32, and the plurality of individual electrodes 44 are arranged on the upper surface of the piezoelectric layer 42. However, the electrodes may be arranged on only the upper surface of the piezoelectric layer 42 in the piezoelectric actuator or may be arranged only on the lower surface of the piezoelectric layer 42 in the piezoelectric actuator.

For example, in a second modified embodiment, as shown in FIGS. 10 to 13, any electrode is not formed on the lower surface of the piezoelectric layer 42, and individual electrodes 132 and a common electrode 134 are formed on the upper surface of the piezoelectric layer 42.

The plurality of individual electrodes 132 are formed on upper surfaces of a plurality of inner areas 140 of the piezoelectric layer 42 overlapped with the plurality of pressure chambers 10 respectively. The area of the piezoelectric layer 42, which is not overlapped with the plurality of pressure chambers 10, is referred to as "outer area 141". Each of the substantially elliptic inner areas includes a first zone 142 which includes the center of the inner area 140 and which is slender in the longitudinal direction (left-right direction as viewed in FIG. 10), and second zones 143 which are positioned between the outer edges of the first zone 142 and the boundary between the inner area 140 and the outer area 141 and which are overlapped with the vicinity portions of the edge of the pressure chamber 10. The pattern of each of the individual electrodes 132 includes three longitudinal-projections 145 which extend in the longitudinal direction of the pressure chamber 10 (inner area 140), and a plurality of widthwise-projections 146 which extend outwardly in the widthwise direction respectively from the two longitudinal-projections 145 positioned on the outer side in the widthwise direction of the pressure chamber 10. The three longitudinal-projections 145 are arranged while being separated from each other by equal spacing distances in the widthwise direction on an upper surface of the first zone 142. On the other hand, the plurality of widthwise-projections 146 are arranged while being separated from each other by equal spacing distances in the longitudinal direction on upper surfaces of the second zones 143.

Figure 10:
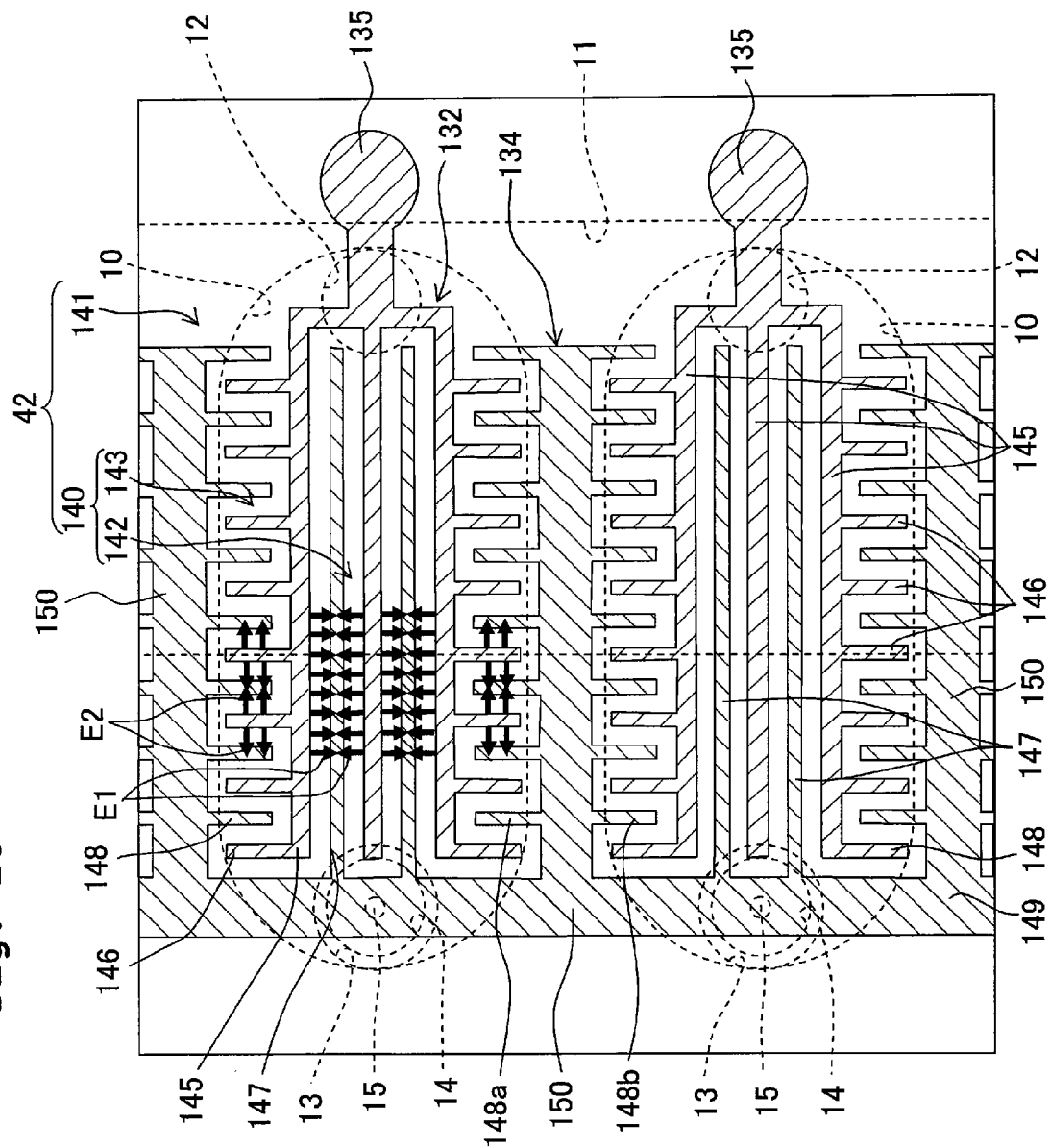
FIG. 10 shows a plan view illustrating the direction of the electric field allowed to act on a piezoelectric layer and a part of an ink-jet head in a second modified embodiment.
Figure 11:
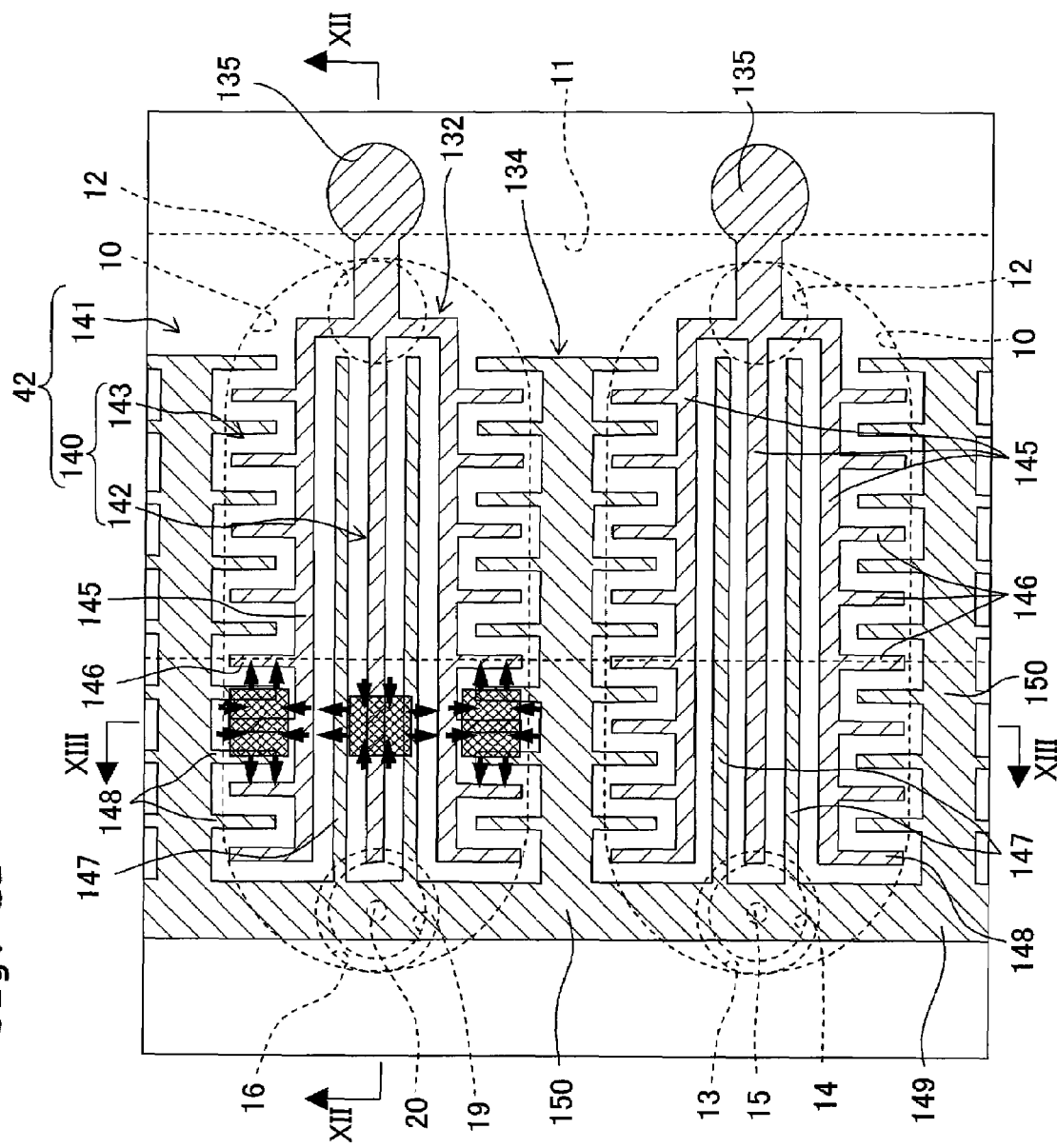
FIG. 11 shows a plan view illustrating the direction of deformation of the piezoelectric layer and the part of the ink-jet head in the second modified embodiment.
Figure 12:
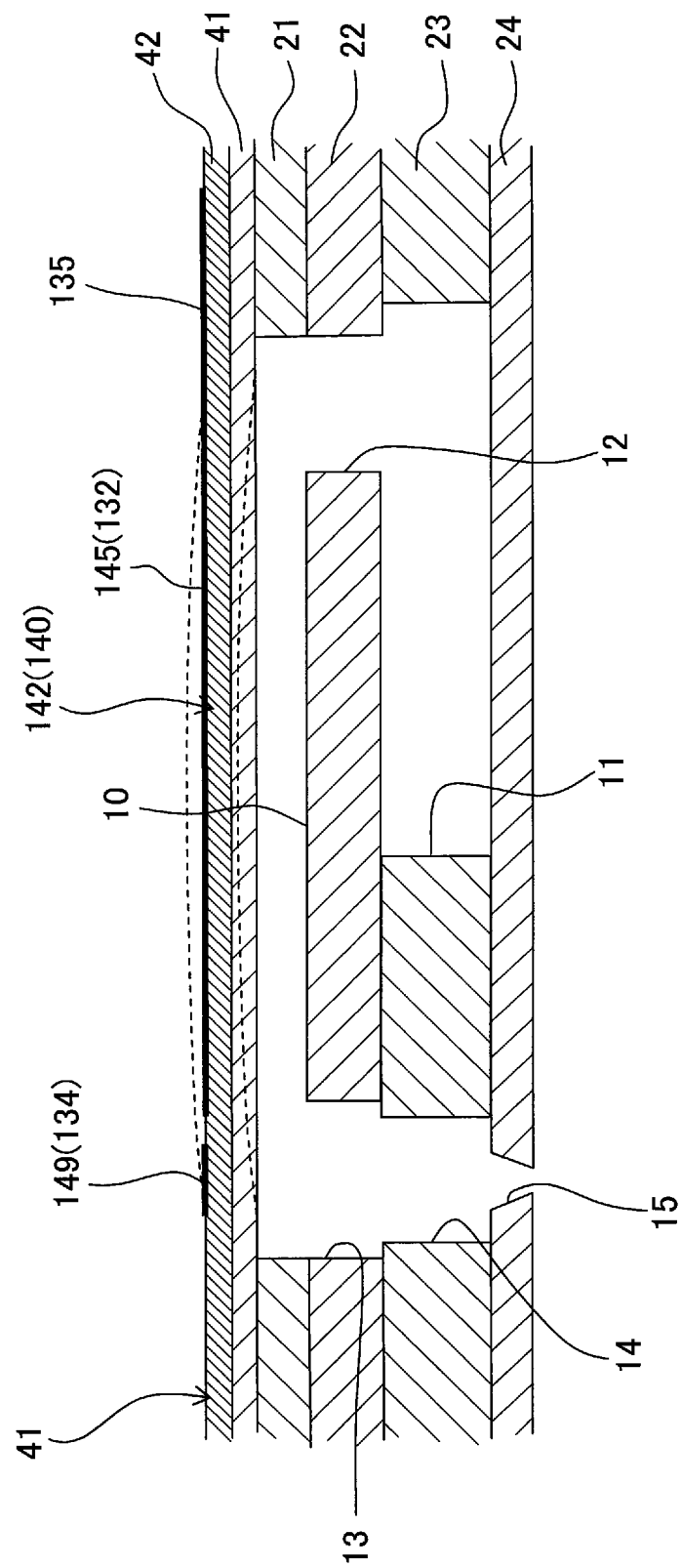
FIG. 12 shows a sectional view taken along a XII-XII line shown in FIG. 11.

The three longitudinal-projections 145 mutually make conduction at their first ends (right ends as viewed in FIG. 10). A contact section 135 is led from the conduction portion to the outer area 141. The plurality of contact sections 135, which correspond to the plurality of individual electrodes 132 respectively, are arranged in the paper feeding direction respectively at the both ends in the scanning direction. Further, an unillustrated wiring member such as FPC is joined to the plurality of contact sections 135. The contact sections 135 are electrically connected to an unillustrated driver IC via the wiring member. The three longitudinal-projections 145 in the first zone 142, the plurality of widthwise-projections 146 in the second zones 143, and the contact section 135 mutually make the conduction, and hence the driving voltage is simultaneously applied from the driver IC via FPC and the contact section 135 to the three longitudinal-projections 145 and the plurality of widthwise-projections 146.

The pattern of the common electrode 134 includes two longitudinal-projections 147 which extend in the longitudinal direction of the pressure chamber 10 respectively between the three longitudinal-projections 145 of the individual electrode 132 of each of the first zones 142, and a plurality of widthwise-projections 148 which extend in the widthwise direction (transverse direction) of the pressure chamber 10 respectively between the plurality of widthwise-projections 146 of the individual electrode 132 of each of the second zones 143. As shown in FIG. 10, the three longitudinal-projections 145 of the individual electrode 132 and the two longitudinal-projections 147 of the common electrode 134 are arranged alternately while being separated from each other by equal spacing distances in the first zone 142. The plurality of widthwise-projections 146 of the individual electrode 132 and the plurality of widthwise-projections 148 of the common electrode 134 are arranged alternately while being separated from each other by equal spacing distances in the second zone 143.

As shown in FIG. 10, all of the longitudinal-projections 147 of the first zones 142, which correspond to the two arrays of the pressure chambers 10 of the left and right arrays respectively, make conduction by a conducting section 149 which extends in the direction of arrangement of the pressure chambers 10 (upward-downward direction as viewed in FIG. 10) at the ends (lefts ends as shown in FIG. 10) disposed on the side opposite to the contact sections 135. The widthwise-projections 148 of the second zones 143 are connected by conducting sections 150 which extend in the longitudinal direction (left-right direction as viewed in FIG. 10) between the two adjoining pressure chambers 10. The conducting sections 150 are connected to the conducting section 149. In other words, the longitudinal-projections 147 and the widthwise-projections 148 of the common electrode 134 mutually make conduction by the aid of the conducting sections 149, 150. The widthwise-projections 148 include first widthwise-projections 148a which extend toward one side (upper side as viewed in FIG. 10) in the widthwise direction of the pressure chamber 10 from the conducting section 150, and second widthwise-projections 148b which extend toward the other side (lower side as viewed in FIG. 10) in the widthwise direction. Both of the first widthwise-projections 148a and the second widthwise-projections 148b function as the common electrode 134 for driving the two adjoining pressure chambers 10. In other words, the first widthwise-projections 148a and the second widthwise-projections 148b, which contribute to the driving of the different pressure chambers 10 respectively, are branched from one conducting section 150 in this structure. The common electrode 134 is efficiently arranged in the limited space. Although not shown in the drawings, two contact sections are led for the two left and right conducting sections 149 respectively to arrive at the both ends in the scanning direction (disposed at the same positions as those of the contact sections 135 of the individual electrodes 132 in relation to the scanning direction). FPC is joined to the two contact sections in the same manner as the contact sections 135 of the individual electrodes 132. All of the longitudinal-projections 147 and the widthwise-projections 148 of the common electrode 134 are always retained at the ground electric potential by the aid of the contact sections and the wiring member such as FPC as described above.

In this way, both of the pattern of the individual electrodes 132 and the pattern of the common electrode 134 are formed on the upper surface of the piezoelectric layer 42. Therefore, when the driving voltage is applied to a certain individual electrode 132, the electric field, which is directed in the direction (in-plane direction) parallel to the surface, is generated in the piezoelectric layer 42 (especially in the upper surface portion) of the inner area 140. As shown in FIG. 10, the first electric field E1, which is composed of the in-plane component directed in the widthwise direction of the pressure chamber 10, is generated as indicated by arrows between the longitudinal direction projections 145 of the individual electrode 132 and the longitudinal direction projections 147 of the common electrode 134 in the first zone 142. On the other hand, the second electric field E2, which is composed of the in-plane component directed in the longitudinal direction of the pressure chamber 10 perpendicular to the first electric field E1, is generated as indicated by arrows between the widthwise direction projections 146 of the individual electrode 132 and the widthwise direction projections 148 of the common electrode 134 in the second zone 143.

The inner area 140 of the piezoelectric layer 42 is subjected to the polarizing treatment in the direction parallel to the surface by previously allowing the high electric field to act by applying the polarizing voltage higher than the driving voltage described above to the individual electrode 132. The polarization is effected in the same direction (widthwise direction of the pressure chamber 10) as that of the first electric field E1 in the first zone 142, and the polarization is effected in the same direction (longitudinal direction of the pressure chamber 10) as that of the second electric field E2 in the second zone 143. Therefore, the direction of polarization of the piezoelectric layer 42 is the same as the direction of the electric field generated when the voltage is applied to the individual electrode 132.

In the piezoelectric actuator of the second modified embodiment, when the driving voltage is selectively applied to the plurality of individual electrodes 132 from the driver IC, the individual electrode 132 and the common electrode 134 are allowed to have the mutually different electric potentials. Accordingly, as shown in FIG. 10, the first electric field E1, which is directed in the widthwise direction of the pressure chamber 10, is generated in the piezoelectric layer 42 of the first zone 142 in the inner area 140 of the piezoelectric layer 131 disposed under or below the individual electrode 132 to which the driving voltage is applied. Further, the second electric field E2, which is directed in the longitudinal direction of the pressure chamber 10, is generated in the piezoelectric layer 42 of the second zone 143.

Figure 13:
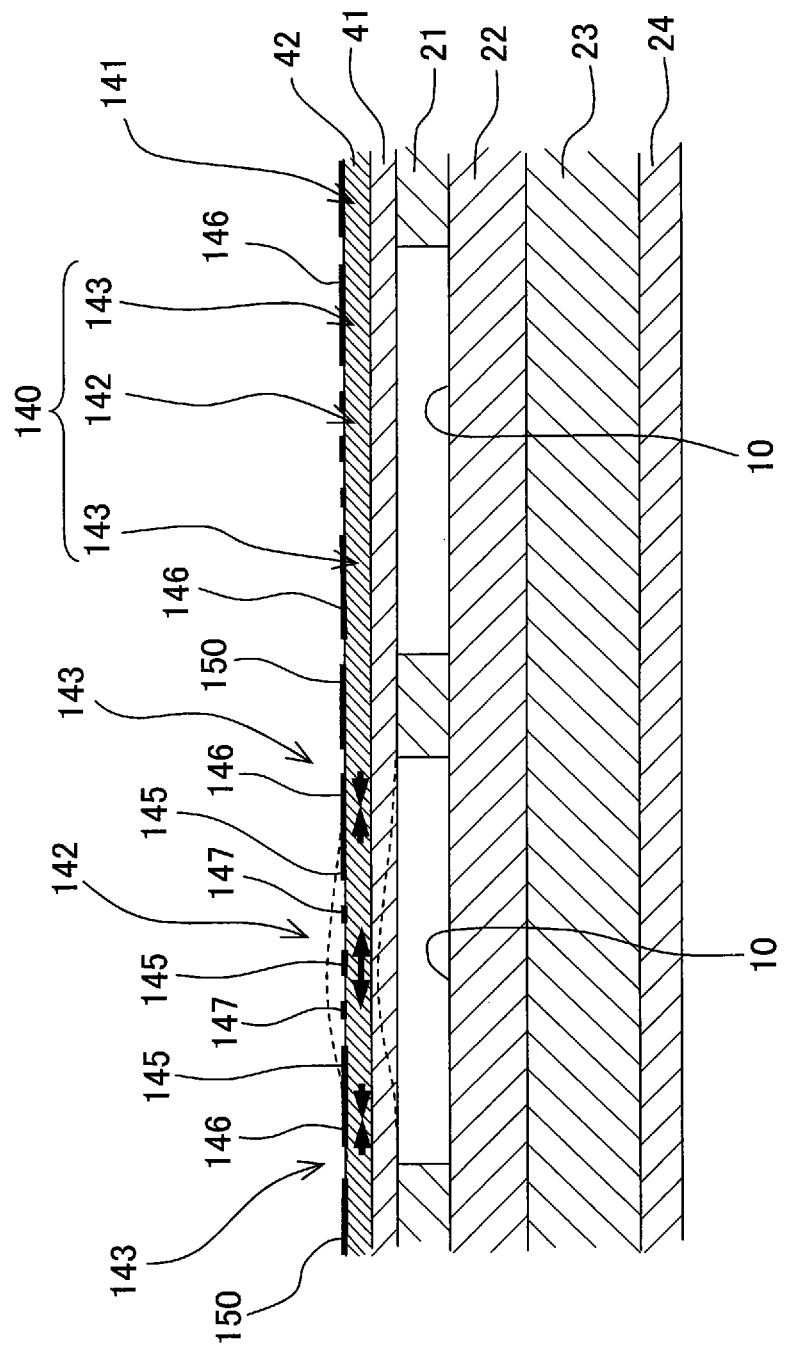
FIG. 13 shows a sectional view taken along a XIII-XIII line shown in FIG. 11.

In this arrangement, as described above, the piezoelectric layer 42 is polarized in the same direction as that of the first electric field E1 in the first zone 142, and the piezoelectric layer 42 is polarized in the same direction as that of the second electric field E2 in the second zone 143. Therefore, as indicated by arrows in FIGS. 11 and 13, the piezoelectric layer 42 is elongated in the widthwise direction of the pressure chamber 10 as the direction of the first electric field E1 in the first zone 142, and the piezoelectric layer 42 is shrunk in the longitudinal direction of the pressure chamber 10. On the other hand, in the second zone 143, the piezoelectric layer 42 is elongated in the longitudinal direction of the pressure chamber 10 as the direction of the second electric field E2, and the piezoelectric layer 42 is shrunk in the widthwise direction of the pressure chamber 10. That is, as shown in FIG. 13, as viewed in the widthwise direction of the pressure chamber 10, the piezoelectric layer 42 is elongated in the first zone 142, and the piezoelectric layer 42 is shrunk in the second zones 143 disposed on the both sides thereof. In this situation, the vibration plate 41, which is positioned under or below the piezoelectric layer 42 of the inner area 140, makes no expansion/contraction in the in-plane direction, and the vibration plate 41 resists the expansion/contraction deformation of the piezoelectric layer 42 of the inner area 140 in the in-plane direction. Further, the piezoelectric layer 42 of the outer area 141 to surround the inner area 140 and the vibration plate 41 disposed thereunder are regulated or restricted for the deformation in the thickness direction. Therefore, as indicated by broken lines in FIGS. 12 and 13, the piezoelectric layer 42 and the vibration plate 41 are greatly curved and deformed so that they protrude in the upward direction (toward the side opposite to the pressure chamber 10). When the vibration plate 41 is curved as described above, then the volume of the pressure chamber 10 is increased, the negative pressure wave is generated in the pressure chamber 10, and the ink is allowed to inflow into the pressure chamber 10 from the manifold channel 13.

After that, the application of the driving voltage to the individual electrode 132 is stopped at the timing at which the negative pressure wave generated in the pressure chamber 10 is inverted into the positive. Accordingly, the piezoelectric layer 42 and the vibration plate 41 are returned to have the original horizontal shapes, and the volume of the pressure chamber 10 is decreased. However, in this situation, the pressure wave which is brought about by the increase in the volume of the pressure chamber 10 as described above and the pressure wave which is generated by the restoration of the vibration plate 41 are combined with each other. Therefore, the large pressure is applied to the ink, and the ink is discharged from the nozzle 15.

When the ink-jet head (piezoelectric actuator) of the second modified embodiment is produced, then the vibration layer 41 is formed as the film on the upper surface of the cavity plate 21, and then the piezoelectric layer 42 is immediately formed as the film on the upper surface of the vibration layer 41. The individual electrodes 132 and the common electrode 134 are formed in the step of forming the individual electrodes 44 in the embodiment of the present invention. The other production steps are the same as or equivalent to those of the embodiment described above, any detailed explanation of which is omitted herein.

When the ink-jet head is produced as described above in the second modified embodiment, it is also possible to obtain the effect which is the same as or equivalent to that obtained in the embodiment described above.

In the embodiment of the present invention, the pressure chambers 10 are formed for the cavity plate 21 by means of the etching. However, the pressure chambers 10 may be formed by means of any other method including, for example, the laser processing. In this case, a plate made of ceramics can be also used as the cavity plate 21. For example, the vibration layer may be formed by stacking another ceramics layer, for example, by means of the AD method on an upper surface of the ceramics plate having a predetermined thickness (~20 μm). In this procedure, the through-holes, which serve as the pressure chambers, can be formed for the cavity plate, for example, by means of the laser processing. The cavity plate and the vibration layer may be formed of the same ceramics material. However, in view of the processability, it is desirable that the cavity plate can be easily subjected to the laser processing as compared with the vibration layer. Even when the ceramics material of the cavity plate contains a large amount of impurities such as metals and silicon, the harmful influence exerted on the piezoelectric performance of the piezoelectric layer is mitigated in the same manner as in the embodiment described above, which would be otherwise caused by the diffusion of the impurities such as metals and silicon when the piezoelectric layer is annealed.

The foregoing description is illustrative of the exemplary case in which the present invention is applied to the production of the ink-jet head for discharging the inks from the nozzles in the pressure chambers and the piezoelectric actuator to be used therefor. However, the present invention is not limited thereto. For example, the present invention is also applicable to the production of a liquid discharge head for discharging any liquid other then the ink from the nozzle and a piezoelectric actuator to be used therefor. The present invention is also applicable to the production of a liquid transport apparatus for transporting any liquid in a liquid transport channel including a pressure chamber by applying the pressure to the liquid contained in the pressure chamber, and a piezoelectric actuator to be used therefor.

Further, the present invention is also applicable to the production of a piezoelectric actuator for driving a predetermined driving objective. In this case, the driving objective may be attached to the portion of the lower surface of the vibration layer 41 exposed to the through-hole formed for the base member.

What is claimed is:

1. A method for producing a piezoelectric actuator, comprising:
   providing a base member;
   forming a vibration layer with a ceramics material on a surface of the base member;
   fixing the vibration layer to the base member by subjecting both the vibration layer and the base member to a temperature below a first temperature at which constitutive atoms are diffused from the base member to the vibration layer, without raising the temperature of the vibration layer and the base member above the first temperature;
   forming a piezoelectric layer on a surface of the vibration layer not facing the base member;
   removing a part of the base member after forming the piezoelectric layer to form a through-hole via which the vibration layer is exposed;
   forming an electrode at a portion of the piezoelectric layer to be overlapped with the through-hole; and
   annealing the piezoelectric layer after forming the through-hole.

2. The method for producing the piezoelectric actuator according to claim 1, wherein the base member is formed of metal or silicon.

3. The method for producing the piezoelectric actuator according to claim 2, wherein the piezoelectric layer is formed by an aerosol deposition method.

4. The method for producing the piezoelectric actuator according to claim 2, wherein the vibration layer is formed by an aerosol deposition method.

5. The method for producing the piezoelectric actuator according to claim 2, wherein the through-hole is formed by an etching.

6. The method for producing the piezoelectric actuator according to claim 5, wherein
the forming of the electrode includes forming an exposed electrode which is exposed on a side, of the piezoelectric layer, not facing the vibration layer; and
the forming of the exposed electrode is performed after the forming of the through-hole.

7. The method for producing the piezoelectric actuator according to claim 2, wherein the forming of the electrode is performed before the annealing of the piezoelectric layer.

8. The method for producing the piezoelectric actuator according to claim 1, wherein the forming of the electrode includes sintering the electrode, and the sintering of the electrode is performed before the forming of the through-hole and at another temperature lower than an annealing temperature to be adopted when the piezoelectric layer is annealed.

9. The method for producing the piezoelectric actuator according to claim 1, wherein the forming of the vibration layer includes sintering the vibration layer, and the sintering of the vibration layer is performed before forming the through-hole and at another temperature lower than an annealing temperature to be adopted when the piezoelectric layer is annealed.

10. The method for producing the piezoelectric actuator according to claim 1, wherein the electrode is formed as a plurality of electrodes arranged on only one surface of the piezoelectric layer, and the piezoelectric layer is polarized in an in-plane direction of the piezoelectric layer by using the plurality of electrodes.

11. The method for producing the piezoelectric actuator according to claim 1, wherein the electrode is formed as a plurality of electrodes arranged on both surfaces of the piezoelectric layer to interpose the piezoelectric layer between the electrodes, and a portion of the piezoelectric layer, which is interposed between the electrodes, is polarized in a thickness direction of the piezoelectric layer.

12. The method for producing the piezoelectric actuator according to claim 1, wherein, before forming the piezoelectric layer, the vibration layer is fixed to the base member at a temperature less than or equal to 600 degrees Celsius.

13. A method for producing a liquid transport apparatus, comprising:
   providing a pressure chamber plate in which a pressure chamber is to be formed;
   forming a vibration layer with a ceramics material on a surface of the pressure chamber plate;
   fixing the vibration layer to the pressure chamber plate by subjecting both the vibration layer and the pressure chamber plate to a temperature below a first temperature at which constitutive atoms are diffused from the pressure chamber plate to the vibration layer, without raising the temperature of the vibration layer and the pressure chamber plate above the first temperature;
   forming a piezoelectric layer on a surface of the vibration layer not facing the pressure chamber plate;
   removing a part of the pressure chamber plate after forming the piezoelectric layer to form the pressure chamber via which the vibration layer is exposed from a side of the pressure chamber plate not facing the vibration layer;
   forming an electrode at a portion of the piezoelectric layer which faces the pressure chamber; and
   annealing the piezoelectric layer after forming the pressure chamber.

14. The method for producing the liquid transport apparatus according to claim 13, wherein the pressure chamber plate is formed of metal or silicon.

* * * * *